(12) United States Patent
Inada

(10) Patent No.: US 9,851,579 B2
(45) Date of Patent: Dec. 26, 2017

(54) OPTICAL SHEET, LIGHT-EMITTING DEVICE, METHOD FOR MANUFACTURING OPTICAL SHEET, AND METHOD FOR MANUFACTURING LIGHT-EMITTING DEVICE

(71) Applicant: Panasonic Intellectual Property Management Co., Ltd., Osaka (JP)

(72) Inventor: Yasuhisa Inada, Osaka (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 376 days.

(21) Appl. No.: 14/396,946

(22) PCT Filed: Jul. 30, 2013

(86) PCT No.: PCT/JP2013/004610
§ 371 (c)(1),
(2) Date: Oct. 24, 2014

(87) PCT Pub. No.: WO2014/020901
PCT Pub. Date: Feb. 6, 2014

(65) Prior Publication Data
US 2015/0085494 A1  Mar. 26, 2015

(30) Foreign Application Priority Data
Aug. 1, 2012  (JP) .................................. 2012-171505

(51) Int. Cl.
*F21V 11/00* (2015.01)
*G02B 27/42* (2006.01)
(Continued)

(52) U.S. Cl.
CPC ...... *G02B 27/425* (2013.01); *B29D 11/00798* (2013.01); *F21V 11/00* (2013.01);
(Continued)

(58) Field of Classification Search
CPC .................................................... G02B 5/0252
See application file for complete search history.

(56) References Cited

U.S. PATENT DOCUMENTS 5,513,025 A  4/1996  Watanabe et al.
5,755,501 A  5/1998  Shinohara et al.
(Continued)

FOREIGN PATENT DOCUMENTS

JP   10-163525    6/1998
JP   2003-248541  9/2003
(Continued)

OTHER PUBLICATIONS

Office Action dated Jun. 3, 2015 for related U.S. Appl. No. 14/560,702.
(Continued)

*Primary Examiner* — Sean Gramling
(74) *Attorney, Agent, or Firm* — Renner, Otto, Boisselle & Sklar, LLP

(57) ABSTRACT

A light-diffusing layer is provided for diffusing incident light by diffracting at least a portion of the incident light, and the diffuse light diffused by the light-diffusing layer is diffused about a direction different from the emission direction of non-diffused light that passes through the light-diffusing layer without being diffused.

18 Claims, 39 Drawing Sheets

(51) Int. Cl.
*G02B 5/02* (2006.01)
*G02B 5/18* (2006.01)
*G02B 5/30* (2006.01)
*H01L 51/52* (2006.01)
*B29D 11/00* (2006.01)
*F21V 13/10* (2006.01)

(52) U.S. Cl.
CPC .............. *F21V 13/10* (2013.01); *G02B 5/02* (2013.01); *G02B 5/021* (2013.01); *G02B 5/18* (2013.01); *G02B 5/30* (2013.01); *H01L 51/5268* (2013.01); *H01L 51/5275* (2013.01)

(56) References Cited

U.S. PATENT DOCUMENTS

| | | | |
|---|---|---|---|
| 7,614,776 | B2 | 11/2009 | Minobe et al. |
| 7,722,194 | B2 | 5/2010 | Amako et al. |
| 7,756,574 | B2 | 7/2010 | Araki et al. |
| 7,972,017 | B2 | 7/2011 | Amako et al. |
| 8,529,114 | B2 | 9/2013 | Nishiwaki |
| 8,704,253 | B2 | 4/2014 | Noda et al. |
| 9,052,096 | B2 | 6/2015 | Nishimura et al. |
| 2003/0184830 | A1* | 10/2003 | Takada ................. G02B 5/0252 359/15 |
| 2006/0114222 | A1 | 6/2006 | Araki et al. |
| 2007/0120136 | A1 | 5/2007 | Noda et al. |
| 2007/0242475 | A1 | 10/2007 | Minobe et al. |
| 2008/0112052 | A1 | 5/2008 | Taira et al. |
| 2008/0304153 | A1 | 12/2008 | Amako et al. |
| 2009/0008672 | A1 | 1/2009 | Osawa et al. |
| 2009/0152533 | A1 | 6/2009 | Chan et al. |
| 2010/0014314 | A1 | 1/2010 | Inokuma et al. |
| 2010/0046236 | A1 | 2/2010 | Nishiwaki |
| 2010/0188747 | A1 | 7/2010 | Amako et al. |
| 2011/0090697 | A1* | 4/2011 | Matsuzaki ........... G02B 5/0215 362/293 |
| 2011/0180823 | A1 | 7/2011 | Usami |
| 2013/0299796 | A1 | 11/2013 | Masuyama et al. |
| 2014/0042426 | A1 | 2/2014 | Nishimura et al. |

FOREIGN PATENT DOCUMENTS

| | | |
|---|---|---|
| JP | 2004-275619 | 10/2004 |
| JP | 2007-165596 | 6/2007 |
| JP | 2007-220970 | 8/2007 |
| JP | 3993882 | 8/2007 |
| JP | 2008-268339 | 11/2008 |
| JP | 2009-015305 | 1/2009 |
| JP | 2009-086613 | 4/2009 |
| JP | 4346680 | 7/2009 |
| JP | 2009-210750 | 9/2009 |
| JP | 2009-231257 | 10/2009 |
| JP | 2011-118327 | 6/2011 |
| JP | 2011-118328 | 6/2011 |
| JP | 4822243 | 9/2011 |
| WO | WO 2005/121844 A1 | 12/2005 |
| WO | WO 2006/003901 A1 | 1/2006 |
| WO | WO 2008/090929 A1 | 7/2008 |
| WO | WO 2009/063636 A1 | 5/2009 |
| WO | WO 2012/147759 A1 | 11/2012 |

OTHER PUBLICATIONS

Extended European Search Report for corresponding European Application No. 14195818.1 dated May 13, 2015.
International Search Report for corresponding International Application No. PCT/JP2013/004610 dated Oct. 22, 2013.
Form PCT/ISA/237 for corresponding International Application No. PCT/JP2013/004610 dated Oct. 22, 2013.
Won Hoe Koo et al., "Light extraction from organic light-emitting diodes enhanced by spontaneously formed buckles", Nature Photonics, vol. 4, p. 222-226, Published Online Feb. 21, 2010.

* cited by examiner $\theta_x = 0°$ $\theta_x = 20°$ $\theta_x = 40°$

OPTICAL SHEET, LIGHT-EMITTING DEVICE, METHOD FOR MANUFACTURING OPTICAL SHEET, AND METHOD FOR MANUFACTURING LIGHT-EMITTING DEVICE

TECHNICAL FIELD

The present invention relates to an optical sheet and a light-emitting device including a light-diffusing layer for diffusing incident light by diffracting at least a portion of the incident light. The present invention further relates to a method for manufacturing the optical sheet and a method for manufacturing the light-emitting device.

BACKGROUND ART

Generally, when light travels from a medium having a high refractive index to a medium having a low refractive index, light incident at angles greater than the critical angle is totally internally reflected. Consequently, in light-emitting devices such as organic electroluminescence light-emitting devices, a problem arises in which light is enclosed internally in the light-emitting device as a result of total internal reflection of light at the boundaries of layered materials. As a solution to this problem, a light-emitting device has been proposed which incorporates an optical sheet for extracting out light incident at angles greater than the critical angle.

For example, Patent Literature (PTL) 1 discloses an optical sheet formed by randomly arranging microscopic recessed and protruding structures. Incorporating this kind of optical sheet into a light-emitting device makes it possible to extract out light by diffusing light by diffracting at least a portion of light incident on the optical sheet at angles greater than the critical angle.

CITATION LIST

Patent Literature

[PTL 1] Japanese Patent No. 4346680
[PTL 2] Japanese Unexamined Patent Application Publication No. 2011-118327
[PTL 3] Japanese Unexamined Patent Application Publication No. 2011-118328
[PTL 4] Japanese Patent No. 4822243

SUMMARY OF INVENTION

Technical Problem

The present invention provides an optical sheet, a light-emitting device, a method of manufacturing the optical sheet, and a method of manufacturing the light-emitting device, each of which improves the extraction efficiency of light.

Solution to Problem

In order to achieve the above object, the optical sheet according to one aspect of the present invention includes a light-diffusing layer for diffusing incident light by diffracting at least a portion of the incident light, wherein diffuse light diffused by the light-diffusing layer is diffused about a direction different from an emission direction of non-diffused light that passes through the light-diffusing layer without being diffused.

Advantageous Effects of Invention

With the optical sheet according to the present invention, it is possible to efficiently extract out light incident on the light-diffusing layer at angles greater than the critical angle, and thus possible to improve the extraction efficiency of light.

DESCRIPTION OF EMBODIMENTS (Underlying Knowledge Forming Basis of the Present Invention)

The inventors have discovered the following problems that occur with respect to the optical sheet disclosed in the Background Art section.

Figure 37A:
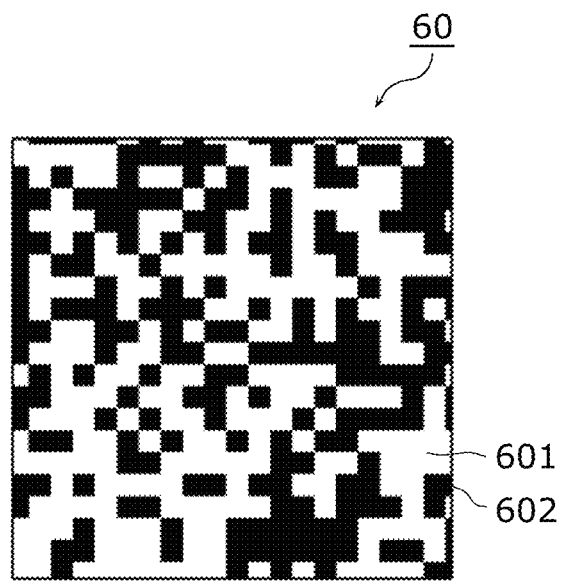
FIG. 37A is a planar view of a conventional optical sheet.

FIG. 37A is a planar view of a conventional optical sheet 60. As is illustrated in FIG. 37A, with the conventional optical sheet 60, a random pattern is formed by randomly arranging a plurality of first microscopic regions 601 (the white quadrilateral regions in FIG. 37A) and a plurality of second microscopic regions 602 (the black quadrilateral regions in FIG. 37A). It should be noted that each of the plurality of first microscopic regions 601 is a protrusion, and each of the plurality of second microscopic regions 602 is a recess.

Figure 37B:
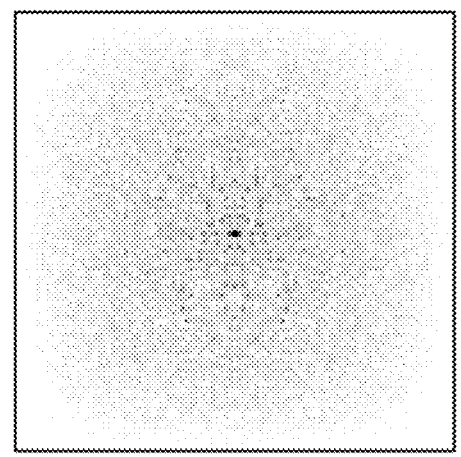
FIG. 37B shows the amplitude of the spatial frequency component of the Fourier transformed random pattern of the optical sheet illustrated in FIG. 37A.

FIG. 37B shows the amplitude of the spatial frequency component of the Fourier transformed pattern of the optical sheet 60 illustrated in FIG. 37A. The component where the spatial frequency is zero (direct current component) is represented in the center of FIG. 37B. In FIG. 37B, the spatial frequency increases from the center out. As can be understood from FIG. 37B, with the spatial frequency of the random pattern of optical sheet 60 in FIG. 37A, low frequency components are comparatively abundant.

Figure 38A:
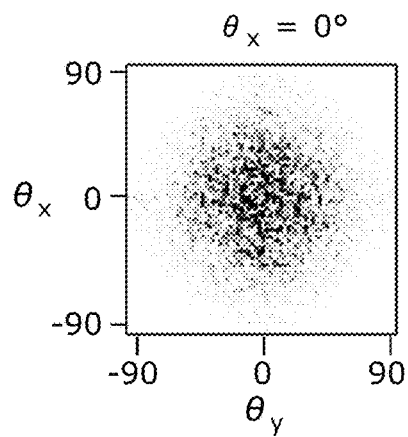
FIG. 38A shows a calculation result of the diffusion pattern of light emitting from the optical sheet when the angle of incidence θx of light incident on the optical sheet is 0°.
Figure 38B:
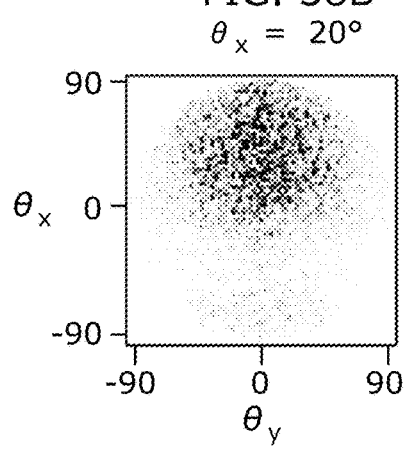
FIG. 38B shows a calculation result of the diffusion pattern of light emitting from the optical sheet when the angle of incidence θx of light incident on the optical sheet is 20°.
Figure 38C:
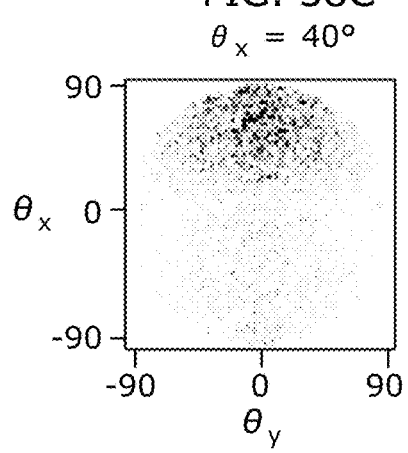
FIG. 38C shows a calculation result of the diffusion pattern of light emitting from the optical sheet when the angle of incidence θx of light incident on the optical sheet is 40°.

FIG. 38A, FIG. 38B, and FIG. 38C show calculation results of the diffusion pattern of light emitting from the optical sheet 60 when the angle of incidence θx of light incident on the optical sheet 60 is 0°, 20°, and 40°. As can be understood from FIG. 38A, FIG. 38B, and FIG. 38C, the diffuse light emitting from the optical sheet 60 is diffused about an emission direction of non-diffused light, which is zeroth order light emitting from the optical sheet 60.

Figure 39:
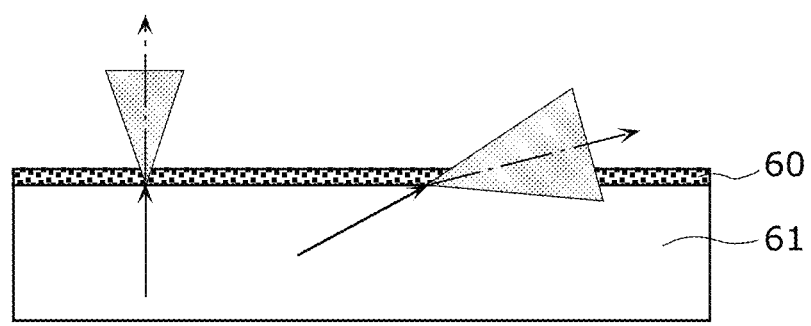
FIG. 39 schematically shows the diffuse light emitting from a conventional optical sheet.

FIG. 39 schematically shows the diffuse light emitting from the conventional optical sheet 60. As is illustrated in FIG. 39, the optical sheet 60 is disposed on the surface of a light-transmissive substrate 61. The light from the light-emitting unit (not shown in the Drawing) is incident on the auxiliary optical sheet 60 after passing through the light-transmissive substrate 61. As described above, the diffuse light emitting from the optical sheet 60 is diffused about an emission direction of non-diffused light, which is zeroth order light emitting from the optical sheet 60 (that is, diffused about the directions indicated by the dotted and dashed arrows in FIG. 39). Consequently, when the angle of incidence of light incident on the optical sheet 60 is larger than the critical angle, since it is only possible to extract out a portion of diffuse light emitting from the optical sheet 60, a problem arises in which the extraction efficiency of light is largely unimproved.

In order to solve the above problem, the optical sheet according to one aspect of the present invention includes a light-diffusing layer for diffusing incident light by diffracting at least a portion of the incident light, wherein diffuse light diffused by the light-diffusing layer is diffused about a direction different from an emission direction of non-diffused light that passes through the light-diffusing layer without being diffused.

According to this aspect, it is possible to efficiently extract out light incident on the light-diffusing layer at angles greater than the critical angle, and thus possible to improve the extraction efficiency of light.

The optical sheet according to one aspect of the present invention includes a light-diffusing layer for diffusing incident light by diffracting at least a portion of the incident light, wherein the light-diffusing layer includes a plurality of first microscopic regions and a plurality of second microscopic regions, the plurality of first microscopic regions and the plurality of second microscopic regions are configured to produce a phase difference between light passing through the plurality of first microscopic regions and light passing through the plurality of second microscopic regions, and the plurality of first microscopic regions and the plurality of second microscopic regions form a pattern having a spatial frequency component that peaks between spatial frequencies of $0.068/(\lambda \times n)$ and $2.8/(\lambda \times n)$, inclusive, where λ is a central light emission wavelength of light incident on the light-diffusing layer and n is a refractive index of a layer in contact with the light-diffusing layer on a side from which light is emitted.

According to this aspect, it is possible to transform more of the light incident on the light-diffusing layer into diffuse light, and it is possible to keep, among diffuse light emitting from the light-diffusing layer, the diffuse light that is emitted in the vicinity of the emission direction of non-diffused (zeroth order) light to a minimum.

The optical sheet according to one aspect of the present invention includes a light-diffusing layer for diffusing incident light by diffracting at least a portion of the incident light, wherein the light-diffusing layer includes a plurality of first microscopic regions and a plurality of second microscopic regions, the plurality of first microscopic regions and the plurality of second microscopic regions are configured to produce a phase difference between light passing through the plurality of first microscopic regions and light passing through the plurality of second microscopic regions, and when light incident on the light-diffusing layer at an angle greater than a critical angle accounts for 50% or more of a total light intensity of light incident on the light-diffusing layer, the plurality of first microscopic regions and the plurality of second microscopic regions form a pattern having a spatial frequency component that peaks between spatial frequencies of $0.055/(\lambda \times n)$ and $0.45/(\lambda \times n)$, inclusive, where $\lambda$ is a central light emission wavelength of light incident on the light-diffusing layer and n is a refractive index of a layer in contact with a side of the light-diffusing layer from which light is emitted.

According to this aspect, when the majority of the light incident on the light-diffusing layer is incident at angles greater than the critical angle, it is possible to transform more of the light incident on the light-diffusing layer into diffuse light, and it is possible to keep, among diffuse light emitting from the light-diffusing layer, the diffuse light that is emitted in the vicinity of the emission direction of non-diffused (zeroth order) light to a minimum.

For example, in the optical sheet according to one aspect of the present invention, the plurality of first microscopic regions may be made of a material having a different refractive index than a refractive index of material of which the plurality of second microscopic regions are made.

According to this aspect, it is possible to produce a phase difference between the light passing through the first microscopic regions and the light passing through the second microscopic regions.

For example, in the optical sheet according to one aspect of the present invention, the plurality of first microscopic regions may be protrusions having planar surfaces, the plurality of second microscopic regions may be recesses having planar surfaces, and the protrusions may have an average height of 1.5 μm or less relative to the recesses.

According to this aspect, it is possible to produce a phase difference between the light passing through the first microscopic regions and the light passing through the second microscopic regions. Moreover, it is possible to increase the extraction efficiency of light by limiting the average height of the protrusions to 1.5 μm or less.

For example, in the optical sheet according to one aspect of the present invention, the diffuse light diffused by the light-diffusing layer may be emitted from the light-diffusing layer in a plurality of directions, and each beam of the diffuse light may be diffused about a direction different from the emission direction of the non-diffused light that passes through the light-diffusing layer without being diffused.

According to this aspect, when the diffuse light is emitted in a plurality of directions, it is possible to efficiently extract out at least a portion of the plurality of diffuse light beams.

The light-emitting device according to one aspect of the present invention includes: a light-emitting unit configured to emits light; and a light-diffusing layer on which light from the light-emitting unit is incident, wherein the light-diffusing layer includes a plurality of first microscopic regions and a plurality of second microscopic regions, the plurality of first microscopic regions and the plurality of second microscopic regions are configured to produce a phase difference between light passing through the plurality of first microscopic regions and light passing through the plurality of second microscopic regions, and the plurality of first microscopic regions and the plurality of second microscopic regions form a pattern having a spatial frequency component that peaks between spatial frequencies of $0.068/(\lambda \times n)$ and $2.8/(\lambda \times n)$, inclusive, where $\lambda$ is a central light emission wavelength of light incident on the light-diffusing layer and n is a refractive index of a layer in contact with a side of the light-diffusing layer from which light is emitted.

According to this aspect, it is possible to efficiently extract out light incident on the light-diffusing layer at angles greater than the critical angle, and thus possible to improve the extraction efficiency of light.

The light-emitting device according to one aspect of the present invention includes: a light-emitting unit configured to emits light; and a light-diffusing layer on which light from the light-emitting unit is incident, wherein the light-diffusing layer includes a plurality of first microscopic regions and a plurality of second microscopic regions, the plurality of first microscopic regions and the plurality of second microscopic regions are configured to produce a phase difference between light passing through the plurality of first microscopic regions and light passing through the plurality of second microscopic regions, and when light incident on the light-diffusing layer at an angle greater than a critical angle accounts for 50% or more of a total light intensity of light incident on the light-diffusing layer, the plurality of first microscopic regions and the plurality of second microscopic regions form a pattern having a spatial frequency component that peaks between spatial frequencies of $0.055/(\lambda \times n)$ and $0.45/(\lambda \times n)$, inclusive, where $\lambda$ is a central light emission wavelength of light incident on the light-diffusing layer and n is a refractive index of a layer in contact with a side of the light-diffusing layer from which light is emitted.

According to this aspect, it is possible to efficiently extract out light incident on the light-diffusing layer at angles greater than the critical angle, and thus possible to improve the extraction efficiency of light.

For example, the light-emitting device according to one aspect of the present invention may further include a light-transmissive substrate through which light from the light-emitting unit passes, wherein the light-diffusing layer may be disposed on a surface of the light-transmissive substrate.

According to this aspect, it is possible to dispose the light-diffusing layer on the surface of the light-transmissive substrate.

For example, the light-emitting device according to one aspect of the present invention may further include a light-transmissive substrate through which light from the light-emitting unit passes, wherein the light-diffusing layer may be disposed between the light-emitting unit and the light-transmissive substrate.

According to this aspect, it is possible to dispose the light-diffusing layer between the light-emitting unit and the light-transmissive substrate.

For example, in the light-emitting device according to one aspect of the present invention, the light-diffusing layer may be disposed in contact with the light-transmissive substrate.

According to this aspect, it is possible to dispose the light-diffusing layer so as to be in contact with the light-transmissive substrate.

For example, the light-emitting device according to one aspect of the present invention may further include an auxiliary optical sheet disposed on a surface of the light-transmissive substrate, wherein the auxiliary optical sheet may have a structure including one of a light-diffusing layer, a diffraction grating, a micro lens, and a pyramid structure, or a combination of at least two of the light-diffusing layer, the diffraction grating, the micro lens, and the pyramid structure.

According to this aspect, it is possible to furthermore provide an auxiliary optical sheet having a structure that includes one of a light-diffusing layer, diffraction grating, micro lens, and pyramid structure. Alternatively, it is possible to furthermore provide an auxiliary optical sheet having a structure that includes a combination of two or more of a light-diffusing layer, diffraction grating, micro lens, and pyramid structure. This makes it possible to further increase the extraction efficiency of light.

For example, the light-emitting device according to one aspect of the present invention may further include a reflective layer that reflects light from the light-emitting unit, wherein the light-diffusing layer may be disposed between the reflective layer and the light-emitting unit.

According to this aspect, it is possible to dispose the light-diffusing layer between the reflective layer and the light-emitting unit.

For example, in the light-emitting device according to one aspect of the present invention, the light-emitting device may be an organic electroluminescence element.

According to this aspect, it is possible to configure the light-emitting device as an organic electroluminescence element.

The optical sheet according to one aspect of the present invention includes a light-diffusing layer having a plurality of protrusions and a plurality of recesses, wherein a spatial frequency component obtained by calculating a Fourier transform of numerical data representing a height distribution of the plurality of protrusions in the light-diffusing layer peaks between spatial frequencies of $0.068/(\lambda \times n)$ and $2.8/(\lambda \times n)$, inclusive, where $\lambda$ is a central light emission wavelength of light incident on the light-diffusing layer and $n$ is a refractive index of a layer in contact with a side of the light-diffusing layer from which light is emitted.

According to this aspect, it is possible to efficiently extract out light incident on the optical sheet at angles greater than the critical angle, and thus possible to improve the extraction efficiency of light.

The light-emitting device according to one aspect of the present invention includes a light-diffusing layer having a plurality of protrusions and a plurality of recesses, wherein a spatial frequency component obtained by calculating a Fourier transform of numerical data representing a height distribution of the plurality of protrusions in the light-diffusing layer peaks between spatial frequencies of $0.068/(\lambda \times n)$ and $2.8/(\lambda \times n)$, inclusive, where $\lambda$ is a central light emission wavelength of light incident on the light-diffusing layer and $n$ is a refractive index of a layer in contact with a side of the light-diffusing layer from which light is emitted.

According to this aspect, it is possible to efficiently extract out light incident on the light-diffusing layer at angles greater than the critical angle, and thus possible to improve the extraction efficiency of light.

The method for manufacturing an optical sheet according to one aspect of the present invention is a method for manufacturing one of the above-described optical sheets, and includes forming a light-diffusing layer by disposing a plurality of first unit structures and a plurality of second unit structures wherein each of the first unit structures is formed by arranging at least two types of microscopic regions in a first pattern, and each of the second unit structures is formed by arranging the at least two types of the microscopic regions in a second pattern different from the first pattern.

According to this aspect, it is possible to efficiently extract out light incident at angles greater than the critical angle, and thus possible to manufacture an optical sheet capable of improving the extraction efficiency of light.

The method for manufacturing a light-emitting device according to one aspect of the present invention is a method for manufacturing one of the above-described light-emitting devices, and includes: forming recesses and protrusions on a light-transmissive substrate; and forming a light-diffusing layer by filling spaces formed by the recesses and the protrusions with a material having a refractive index different from a refractive index of the light-transmissive substrate.

According to this aspect, it is possible to efficiently extract out light incident on the optical sheet at angles greater than the critical angle, and thus possible to manufacture a light-emitting device capable of improving the extraction efficiency of light.

Hereinafter, embodiments of the present invention are described with reference to the Drawings. Each of the exemplary embodiments described below shows a general or specific example. The numerical values, shapes, materials, structural elements, the arrangement and connection of the structural elements, steps, the processing order of the steps etc. shown in the following exemplary embodiments are mere examples, and therefore do not limit the scope of the appended Claims and their equivalents. Therefore, among the structural elements in the following exemplary embodiments, structural elements not recited in any one of the independent claims are described as arbitrary structural elements.

Embodiment 1

Light-Emitting Device Configuration

Figure 1:
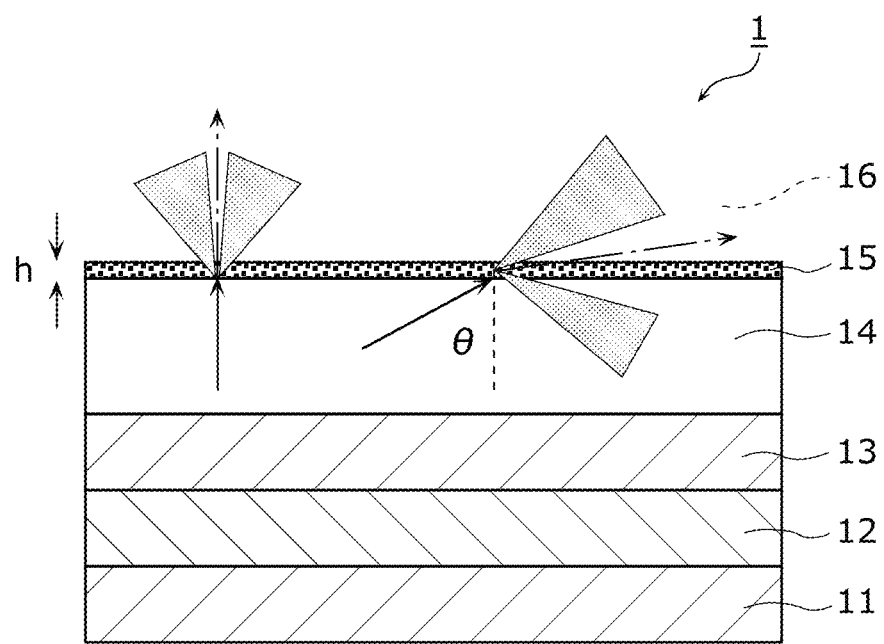
FIG. 1 is a cross sectional view of the light-emitting device according to Embodiment 1.

FIG. 1 is a cross sectional view of a light-emitting device 1 according to Embodiment 1. In Embodiment 1, the light-emitting device 1 includes an electrode 11, a light-emitting layer 12 (including a light-emitting unit), a light-transmissive electrode 13, a light-transmissive substrate 14, and an optical sheet 15 (or a light-diffusing layer 151) layered in this order. It should be noted that in Embodiment 1, the light-emitting device 1 is, for example, an organic electroluminescence element or a light emitting diode (LED).

When the electrode 11 has light reflecting properties, the electrode 11 functions to return light generated in the light-emitting layer 12 toward an atmospheric layer 16. When the electrode 11 has light transmitting properties, the light-emitting device 1 can be configured to be light-transmissive. Since either configuration achieves the advantageous effect of improving the efficiency of light extraction, both are included in the scope of the present invention. Hereinafter, the electrode 11 is exemplified as having light reflecting properties. It should be noted that the electrode 11 is, for example, a cathode.

Electrons (or holes) are injected into the light-emitting layer 12 from the electrode 11 in response to a predetermined voltage being applied across the electrode 11 and the light-transmissive electrode 13. For example, silver (Ag), aluminum (Al), copper (Cu), magnesium (Mg), lithium (Li), or natrium (Na) can be used as material for the electrode 11.

Moreover, the electrode 11 may be formed by disposing a layer of, for example, indium in oxide (ITO) or a mixture of polythiophene and polystyrene sulfonate (PEDOT:PSS) so as to be in contact with the above-described metal.

The light-transmissive electrode 13 is, for example, an anode having light transmitting properties. Holes (or electrons) are injected into the light-emitting layer 12 from the light-transmissive electrode 13 in response to a predetermined voltage being applied across the electrode 11 and the light-transmissive electrode 13. for example, indium in oxide (ITO), indium zinc oxide (IZO), or a mixture of polythiophene and polystyrene sulfonate (PEDOT:PSS) can be used as material for the light-transmissive electrode 13.

For example, when the light-emitting device 1 is an organic electroluminescence element, an electron transport layer and a hole transport layer (not shown in the Drawings), for example, may be disposed sandwiching the light-emitting layer 12. The electron transport layer is disposed on the electrode 11 side of the light-emitting layer 12, and the hole transport layer is disposed on the light-transmissive electrode 13 side of the light-emitting layer 12. It should be noted that when the electrode 11 is an anode, the electron transport layer is disposed on the light-transmissive electrode 13 side of the light-emitting layer 12, and the hole transport layer is disposed on the electrode 11 side of the light-emitting layer 12. Material used for the electron transport layer may be appropriately selected from a group of chemical compounds having electron transporting properties. Examples of chemical compounds in this sort of group include metal complexes known to be used as electron transporting materials such as tris(8-hydroxyquinolinato) aluminum (Alq3) and hetero ring compounds such as phenanthroline derivatives, pyridine derivatives, tetrazine derivatives, and oxadiazole derivatives. However, the material used for the electron transport layer is not limited to these materials. It is possible for any commonly known, arbitrary electron transport material to be used, and a material having a high electron transporting property is particularly appropriate. Material used for the hole transport layer may be appropriately selected from a group of chemical compounds having hole transporting properties. Examples of chemical compounds in this sort of group include representative examples of triarylamine based compounds, amine compounds including a carbazole group, and amine compounds including a fluorine derivative. These representative examples include 4,4'-Bis[N-(naphthyl)-N-phenyl-amino] biphenyl (α-NPD), N,N'-Bis(3-methylphenyl)-(1,1'-biphenyl)-4,4'-diamine (TPD), 2-TNATA, 4,4',4''-tris(N-(3-methylphenyl)N-phenylamino)triphenylamine (MTD ATA), 4,4'-N,N'-dicarbazolebiphenyl (CBP), Spiro-NPD, Spiro-TPD, Spiro-TAD and TNB. However, the material for the hole transport layer is not limited to these materials. It is possible for any commonly known, arbitrary hole transport material to be used.

The light-transmissive substrate 14 is provided to support the light-transmissive electrode 13. Material used for the light-transmissive substrate 14 may be, for example, a light-transmissive material such as glass or resin. The light-transmissive substrate 14 generally has a refractive index of about 1.45 to 1.65. It should be noted that a high refractive index substrate having a refractive index of about 1.65 to 2.0 may be used as the light-transmissive substrate 14. Moreover, when the light-transmissive electrode 13 is not required to be supported, provision of the light-transmissive substrate 14 is not absolutely necessary. Examples of when provision of the light-transmissive substrate is not absolutely necessary include when a substrate for supporting the electrode 11 is provided or when the electrode 11 is of a thickness that does not require support, for example.

The optical sheet 15 includes a light-diffusing layer 151 (to be described later) at least on the surface that is in contact with the atmospheric layer 16. The optical sheet 15 is disposed on a surface of the light-transmissive substrate 14 (that is, disposed on the surface of the light-transmissive substrate 14 that is opposite the side adjacent the light-transmissive 13). Alternatively, the light-diffusing layer 151 is disposed directly on the surface of the light-transmissive substrate 14. When the light-transmissive substrate 14 is not provided, the optical sheet 15 or the light-diffusing layer 151 is provided adjacent to the light-transmissive electrode 13. At least a portion of the light incident on the light-diffusing layer 151 emits from the light-diffusing layer 151 after being diffused by light diffraction phenomenon. As will be described later, diffuse light emitting from the light-diffusing layer 151 is diffused about a direction different from an emission direction (in other words, the directions indicated by the dot-and-dashed arrows in FIG. 1) of non-diffused light, which is zeroth order light emitting from the light-diffusing layer 151. It should be noted that since zeroth order light is incident light that is transmitted through without being diffused, the angle of emission thereof is defined by Snell's law. In other words, the angle of emission $\theta_1$ of zeroth order light can be expressed as shown in Equation 1 below, where the angle of incidence of incident light is $\theta_0$, the refractive index of the medium on the side of incidence is $n_0$, and the refractive index of the medium on the side of emission is $n_1$.

[MATH 1]

$$n_0 \sin \theta_0 = n_1 \sin \theta_1 \qquad \text{Equation 1}$$

Even when all of the incident light is diffused by the light-diffusing layer 151, it is possible to calculate the angle of emission of zeroth order light with above Equation 1, and a configuration in which diffuse light is diffused about a direction different from that emission direction is included in the present invention. The configuration of the light-diffusing layer 151 will be described in detail later. It should be noted that in Embodiment 1, the optical sheet 15 or the light-diffusing layer 151 is disposed on the surface of the light-transmissive substrate 14, but the optical sheet 15 or the light-diffusing layer 151 may be disposed inside the light-transmissive substrate 14.

A portion of the light generated by the light-emitting layer 12 is incident on the light-diffusing layer 151 after passing through the light-transmissive electrode 13 and the light-transmissive substrate 14. Moreover, a portion of the light generated by the light-emitting layer 12 is incident on the light-diffusing layer 151 after being reflected off the electrode 11 and passing through the light-transmissive electrode 13 and the light-transmissive substrate 14. At least a portion of the light incident on the light-diffusing layer 151 is extracted to the atmospheric layer 16, which is external to the light-emitting device 1, by diffusion by diffraction. It should be noted that the refractive index of the atmospheric layer 16 is, for example 1.0.

[Optical Sheet Configuration]

Figure 2A:
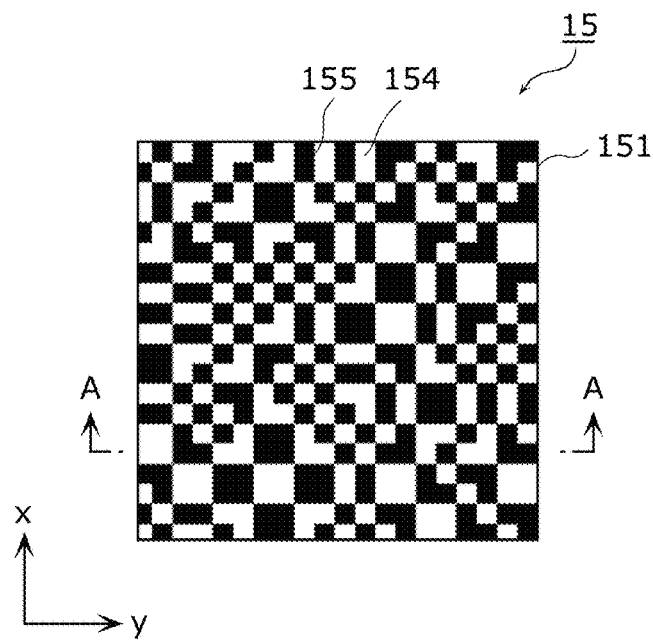
FIG. 2A is a planar view of the optical sheet according to Embodiment 1.
Figure 2B:
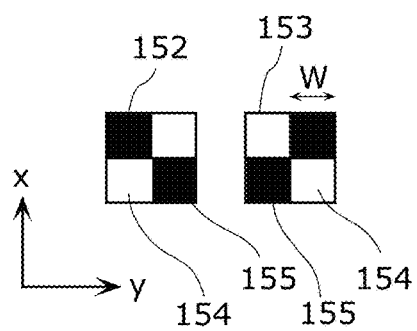
FIG. 2B is a planar view of the first unit structure and the second unit structure of the optical sheet shown in FIG. 2A.
Figure 2C:
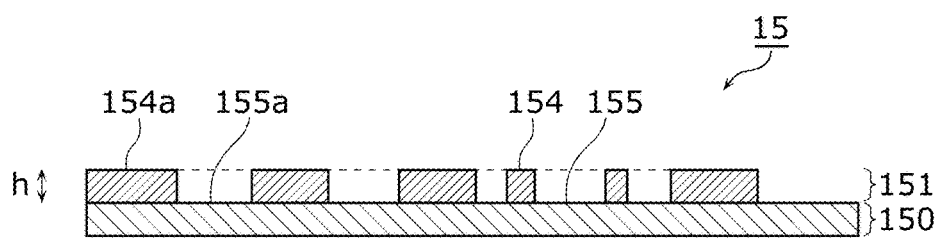
FIG. 2C is a cross sectional view of the optical sheet cut at the line A-A shown in FIG. 2A.

FIG. 2A is a planar view of the optical sheet 15 device 1 according to Embodiment 1. FIG. 2B is a planar view of the first unit structure 152 and the second unit structure 153 included in the optical sheet 15 shown in FIG. 2A. FIG. 2C is a cross sectional view of the optical sheet 15 cut at the line A-A shown in FIG. 2A.

As is illustrated in FIG. 2A, the optical sheet 15 includes the light-diffusing layer 151 that diffuses incident light by diffraction. In Embodiment 1, the light-diffusing layer 151 included in the optical sheet 15 is disposed at the boundary in contact with the atmospheric layer 16 (the atmospheric layer 16 is, in other words, the layer in contact on the side from which light is emitted). The light-diffusing layer 151 is formed by disposing a plurality of the first unit structures 152 and second unit structures 153 shown in FIG. 2B.

The first unit structure 152 is formed by arranging two first microscopic regions 154 and two second microscopic regions 155 in a first pattern. It should be noted that the first pattern is a pattern in which the two first microscopic regions 154 are aligned diagonal to each other and the two second microscopic regions 155 are aligned diagonal to each other. In a planar view, the first unit structure 152 has a quadrilateral (square) shape.

The second unit structure 153 is formed by arranging two first microscopic regions 154 and two second microscopic regions 155 in a second pattern different from the first pattern. It should be noted that the second pattern is a mirror pattern of the first pattern in which the first microscopic regions 154 and the second microscopic regions 155 have been reversed. In a planar view, the second unit structure 153 has a quadrilateral (square) shape.

The first microscopic region 154 includes a protrusion 154a, which is the area indicated by the white square in FIG. 2b, that protrudes toward the atmospheric layer 16. The protrusion 154a has a planar surface that is flat with respect to the stacking direction. A planar surface is a surface that is flat when a structure of a size that does not recognize light is ignored (of a size that is adequately smaller than the wavelength of the light). The second microscopic region 155 includes a recess 155a, which is the area indicated by the black square in FIG. 2b, that recedes toward the light-transmissive substrate 14. The recess 155a has a planar surface that is flat with respect to the stacking direction. In a planar view, each first microscopic region 154 and second microscopic region 155 has a quadrilateral (square) shape. With the above configuration, a phase difference is produced between light passing through the first microscopic region 154 and light passing through the second microscopic region 155. For example, the phase difference between light is expressed as $(n_1-n_2) \times d/\lambda$, where $n_1$ is the refractive index of the first microscopic region 154, $n_2$ is the refractive index of the second microscopic region 155, $\lambda$ is the wavelength of light, and d is the distance that light travels to pass through one of the first microscopic region 154 and the second microscopic region 155. It should be noted that the phase difference between light may be achieved by a structure having recesses and protrusions, or achieved by forming the first microscopic region 154 and the second microscopic region 155 from materials having different refractive indices.

As is illustrated in FIG. 2A, in the light-diffusing layer 151, the plurality of first microscopic regions 154 and the plurality of second microscopic regions 155 are arranged to form a pattern.

It should be noted that in Embodiment 1, each of the protrusions 154a has approximately the same height h relative to the recesses 155a, as is illustrated in FIG. 2C. As will be described later, a height h of each of the protrusions 154a relative to the recesses 155a of 1.5 μm or less is ideal.

[Method for Manufacturing and Configuration of Optical Sheet]

In Embodiment 1, the pattern of the light-diffusing layer 151 in the optical sheet 15 is determined by arranging the plurality of first unit structures 152 and the plurality of second unit structures 153, but different methods for determining the pattern, such as the methods described in the other embodiments below, may be used. Alternatively, a pattern that controls the spatial frequency may be determined using the methods described in, for example, PTL 2 and 3.

Methods for manufacturing the optical sheet 15 according to Embodiment 1 having this sort of pattern include, for example, a method using a semiconductor process or cutting, or a method of transferring, by nanoprinting, a metal die made using a semiconductor process or cutting, for example.

When the recesses and protrusions are formed by direct working of the material by using a semiconductor process or cutting, the optical sheet 15 has a configuration like that illustrated in FIG. 2C. In other words, as is illustrated in FIG. 2C, the light-diffusing layer 151 is formed of recesses and protrusions fabricated on a substrate 150. It should be noted that the substrate 150 and the first microscopic region 154 may be formed from the same material. When the fabrication is microscopic, where the pattern is kept to within the micron magnitude, a semiconductor process is advantageous. When a semiconductor process is used, a stepped structure having planar surfaces (the level of the height is discrete) can easily be fabricated. For example, when the structure has two levels of different heights, fabrication is possible in one etching process. Moreover, by performing a second etching process, it is possible to fabricate a structure having three or four levels of different heights.

Figure 2D:
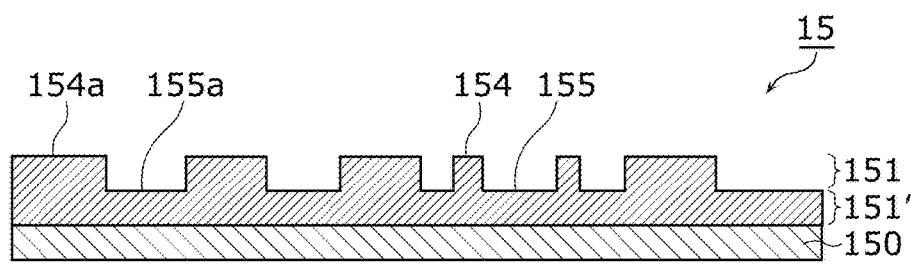
FIG. 2D is a cross sectional view of the optical sheet when the optical sheet is manufactured using nanoprinting.

FIG. 2D is a cross sectional view of the optical sheet 15 when the optical sheet 15 is manufactured using nanoprinting. When the optical sheet 15 is manufactured by nanoprinting, first a metal die is pressed into liquid resin, and then the resin is hardened. The first microscopic regions 154 and the second microscopic regions 155 are formed as a result of the recesses and protrusions on the metal die being transferred to the liquid resin. At this time, a residual film portion 151' remains in the resin where the recesses and protrusions of the metal die are not transferred, as is illustrated in FIG. 2D.

It should be noted that a light-transmissive adhesive, for example, may be used to secure the optical sheet 15 such as the ones illustrated in FIG. 2C and FIG. 2D to the light-transmissive substrate 14.

[Configuration in which the Light-Diffusing Layer is Directly Formed on the Surface of the Light-Transmissive Substrate]

Figure 2E:
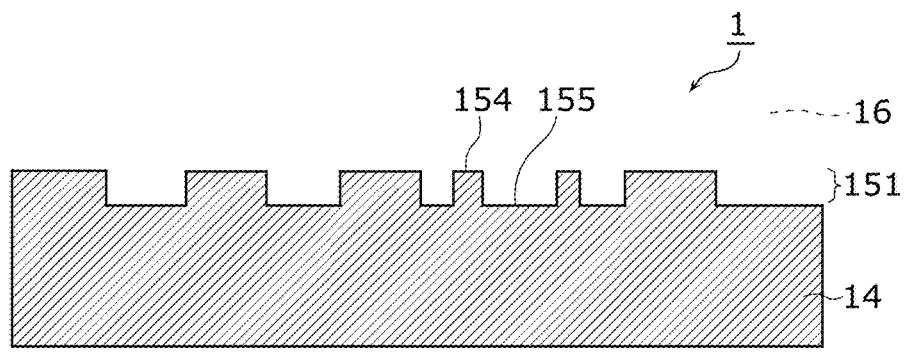
FIG. 2E is a cross sectional view of a portion of the light-emitting device when the light-diffusing layer is formed on the surface of the light-transmissive substrate.

The pattern of the light-diffusing layer 151 is determined by the same method described above where the optical sheet 15 is disposed on the surface 14 of the light-transmissive substrate. FIG. 2E is a cross sectional view of a portion of the light-emitting device 1 when the light-diffusing layer 151 is formed on the surface of the light-transmissive substrate 14 by using a semiconductor process or cutting.

As is illustrated in FIG. 2E, when manufacturing the light-emitting device 1, first recesses and protrusions 154 and 155 are formed on the light-transmissive substrate 14, and then the spaces formed by the recesses and protrusions 154 and 155 are filled in with a material having a different refractive index than the light-transmissive substrate 14. With this, the light-diffusing layer 151 of recesses and protrusions can be formed directly on the surface of the light-transmissive substrate 14.

Since total internal reflection of light is kept to a minimum in the light-diffusing layer 151 and the advantageous effect of improving the efficiency of light extraction is achieved with any of the above manufacturing methods, they are included in the scope of the present invention.

It should be noted that when the refractive index $n_1$ of the first microscopic region 154 and the refractive index $n_2$ of the second microscopic region 155 ($n_1 > n_2$) are both lower than the refractive index of the light-transmissive substrate 14, light incident on the light-diffusing layer 151 at an angle above the critical angle is totally internally reflected off the boundary between the light-transmissive substrate 14 and the light-diffusing layer 151 and does not reach the first microscopic regions 154 and the second microscopic regions 155. Consequently, the refractive index $n_1$ of the first microscopic region 154 is ideally substantially equal to or higher than the refractive index of the light-transmissive substrate 14. Moreover, in order to generate an adequate phase difference between light, the refractive index $n_2$ of the second microscopic region 155 is ideally a smaller value than the refractive index $n_1$ of the first microscopic region 154 and substantially the same as the refractive index of the atmospheric layer 16. Material used for the first microscopic region 154 may be, for example, a light-transmissive material such as glass or resin. Material used for the second microscopic region 155 may be, for example, a light-transmissive material such as air or a resin that has a low refractive index.

[Light-Diffusing Layer Characteristics]

Figure 3:
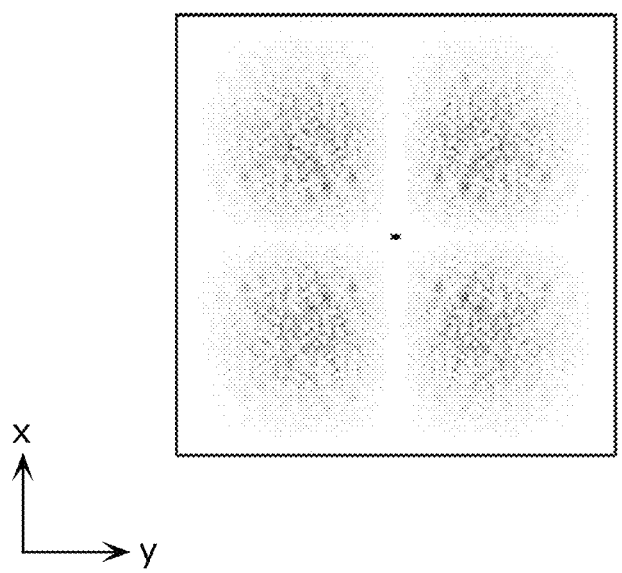
FIG. 3 shows the amplitude of the spatial frequency component of the Fourier transformed pattern of the light-diffusing layer illustrated in FIG. 2A.

FIG. 3 shows the amplitude of the spatial frequency component of the Fourier transformed pattern of the light-diffusing layer 151 illustrated in FIG. 2A. The spatial frequency component of zero (direct current component) is represented in the center of FIG. 3. In FIG. 3, the spatial frequency increases from the center out. As can be understood from FIG. 3, with the spatial frequency of the pattern of the light-diffusing layer 151 in FIG. 2A, the low frequency components are keep to a minimum.

Moreover, although it does not directly affect the efficiency of light extraction, the characteristic in which the spatial frequency component is zero in the X and Y directions can be seen in FIG. 3. This is because the integral value of the phase difference in the X axis direction and the integral value of the phase difference in the Y axis direction in each of the first unit structure 152 and the second unit structure 153 shown in FIG. 2B are each zero. As a result, even in a pattern formed by disposing a plurality of the first unit structures 152 and second unit structures 153, like the pattern shown in FIG. 2A, the spatial frequency component in the X axis direction and the spatial frequency component in the Y axis direction are both zero.

Figure 4A:
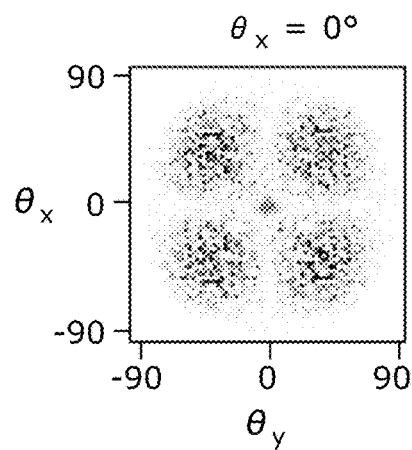
FIG. 4A shows a calculation result of the diffusion pattern of light emitting from the light-diffusing layer when the angle of incidence θx of light incident on the light-diffusing layer is 0°.
Figure 4B:
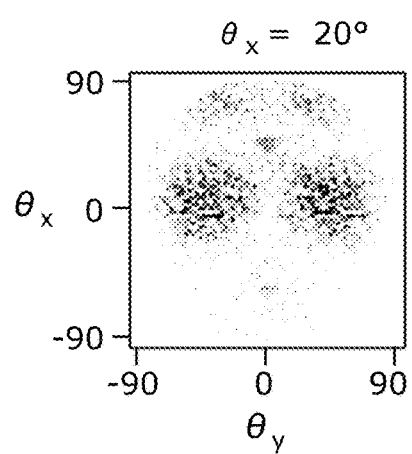
FIG. 4B shows a calculation result of the diffusion pattern of light emitting from the light-diffusing layer when the angle of incidence θx of light incident on the light-diffusing layer is 20°.
Figure 4C:
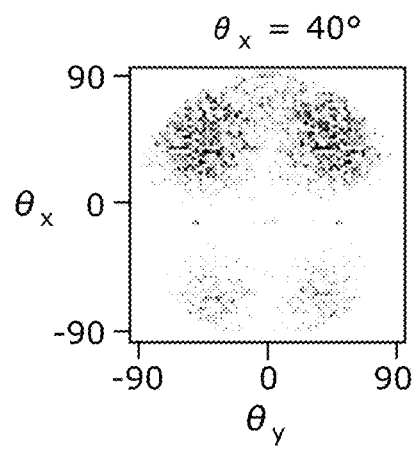
FIG. 4C shows a calculation result of the diffusion pattern of light emitting from the light-diffusing layer when the angle of incidence θx of light incident on the light-diffusing layer is 40°.

FIG. 4A, FIG. 4B, and FIG. 4C show calculation results of the diffusion pattern of light emitting from the light-diffusing layer 151 when the angle of incidence θx of light incident on the light-diffusing layer 151 is 0°, 20°, and 40°. Conditions for the calculation were set as follows. The refractive index of the first microscopic region 154 and the refractive index of the light-transmissive substrate 14 were set to 1.5, the refractive index of the second microscopic region 155 and the refractive index of the atmospheric layer 16 were set to 1.0, the wavelength of the light incident on the light-diffusing layer 151 was 550 nm, the unit size w of the first microscopic region 154 and the second microscopic region 155 were 0.6 µm each, and the height h of the first microscopic region 154 (the protrusion 154a) was 0.6 µm. It should be noted that the unit size w is the length of one side of the first microscopic region 154 and the second microscopic region 155 in a planar view.

As can be understood from FIG. 4A, the calculation result of the diffusion pattern when the angle of incidence θx of the light incident on the light-diffusing layer 151 is 0° is the same as the result of the Fourier transform shown in FIG. 3. This is because the Fraunhofer diffraction phenomenon when the light is incident on the light-diffusing layer 151 matches the result of the Fourier transform of the phase difference given at the surface of diffraction. Moreover, as can be understood from FIG. 4B and FIG. 4C, even when the angle of incidence is in the range θx>0°, the diffuse light emitting from the light-diffusing layer 151 is diffused about a direction different from the emission direction of non-diffused light, which is zeroth order light emitting from the light-diffusing layer 151. From this result, one can deduce that it is possible to diffuse light incident at any angle about a direction different from the emission direction of non-diffused light, which is zeroth order light, by keeping the low spatial frequency components to a minimum in a planar pattern, like the structure shown in FIG. 2A.

Figure 5:
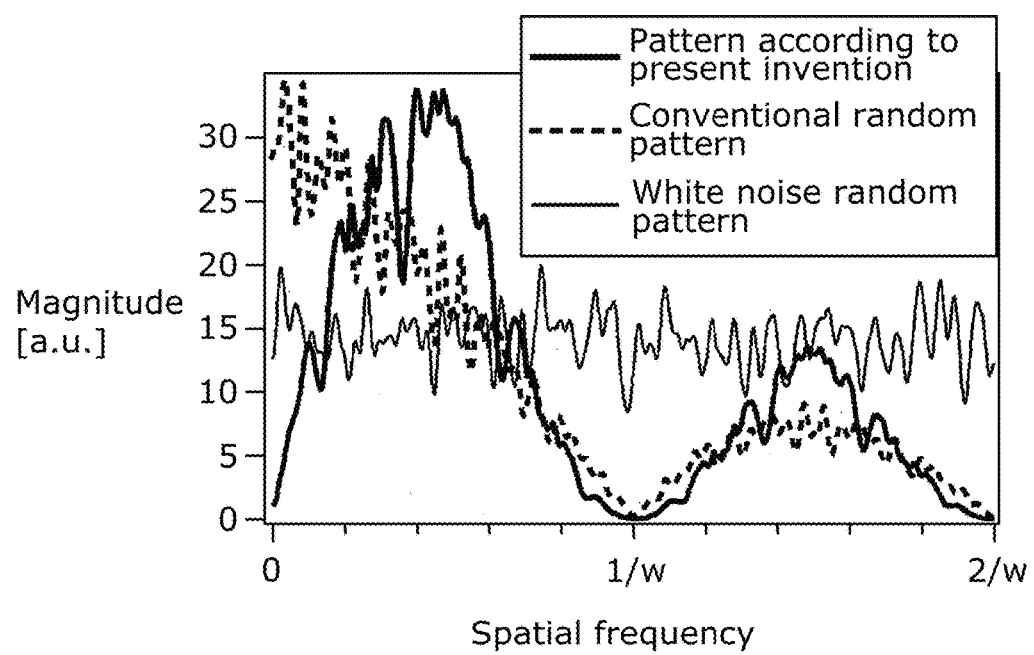
FIG. 5 shows a one-dimensional distribution in one azimuth among the spatial frequencies obtained through Fourier transform of the pattern of the light-diffusing layer.

Next, the pattern of the light-diffusing layer 151 will be considered based on spatial frequency. FIG. 5 shows a one-dimensional distribution in one azimuth among the spatial frequencies obtained through Fourier transform of the pattern of the light-diffusing layer 151. In FIG. 5, the spatial frequency of the pattern is represented on the horizontal axis and the magnitude of the spatial frequency is represented on the vertical axis. Moreover, in FIG. 5, the bold line represents a one-dimensional distribution of the spatial frequency of the pattern according to Embodiment 1, the dashed line represents a one-dimensional distribution of the spatial frequency of a conventional random pattern (for example, the pattern disclosed in PTL 1), and the thin line represents a one-dimensional distribution of the spatial frequency of a pattern generally referred to as white noise (for example, a pattern of structures having random sizes arranged in random positions).

As is illustrated in FIG. 5, the spatial frequency of the pattern according to Embodiment 1 peaks at a spatial frequency in the vicinity of $1/(2w)$. Furthermore, among spatial frequency components of this pattern, high spatial frequencies in the vicinity of $1/w$ and low spatial frequencies in the vicinity of 0 are kept to a minimum relative to the peak. In other words, the spatial frequency component of this pattern has a peak-and-valley magnitude distribution wherein spatial frequencies in the vicinities of $1/w$ and 0 are kept to a minimum and spatial frequencies in the vicinity of $1/(2w)$ are at the peak. This magnitude distribution curve has a half bandwidth of around $1/(2w)$, for example. It should be noted that this magnitude distribution curve preferably has a light-emitting element light-emitting wavelength spectrum width of Δλ or greater in the vicinity of the peak component $1/(2w)$. In other words, it preferably has a width of $1/(2w \pm \Delta\lambda/2)$ or greater. With this, light of different wavelengths generated by the light-emitting element can be extracted. It should be noted that w is the above-described unit size w. Since spatial frequencies greater than the reciprocal of the wavelength of the light do not contribute to diffraction of the light, it is possible to transform more of the light incident on the light-diffusing layer 151 into diffuse light by keeping spatial frequencies in the vicinity of $1/w$ and higher to a minimum relative to the peak. Furthermore, by keeping low spatial frequencies in the vicinity of 0 to a minimum relative to the peak, it is possible to keep, among diffuse light emitted from the light-diffusing layer 151, the diffuse light that is emitted in the vicinity of the emission direction of non-diffused (zeroth order) light to a minimum. In contrast, with the conventional random pattern, the peak is present in the low spatial frequencies in the vicinity of 0, and with the white noise pattern, all spatial frequencies are within a constant amplitude range.

As shown above, the light-diffusing layer 151 according to Embodiment 1 has completely different properties than, for example, the optical sheet 60 shown in FIG. 37A. As is illustrated in FIG. 1, diffuse light emitting from the light-diffusing layer 151 according to Embodiment 1 is diffused about a direction different from an emission direction of non-diffused light, which is zeroth order light emitting from the light-diffusing layer 151. Conversely, as is illustrated in FIG. 39, diffuse light emitting from the conventional optical sheet 60 is diffused about an emission direction of non-diffused light, which is zeroth order light emitting from the optical sheet 60. Consequently, with the light-diffusing layer 151 according to Embodiment 1, light incident on the light-diffusing layer 151 at an angle of incidence greater than the critical angle can be more efficiently extracted out, in comparison to the conventional optical sheet 60.

Figure 6:
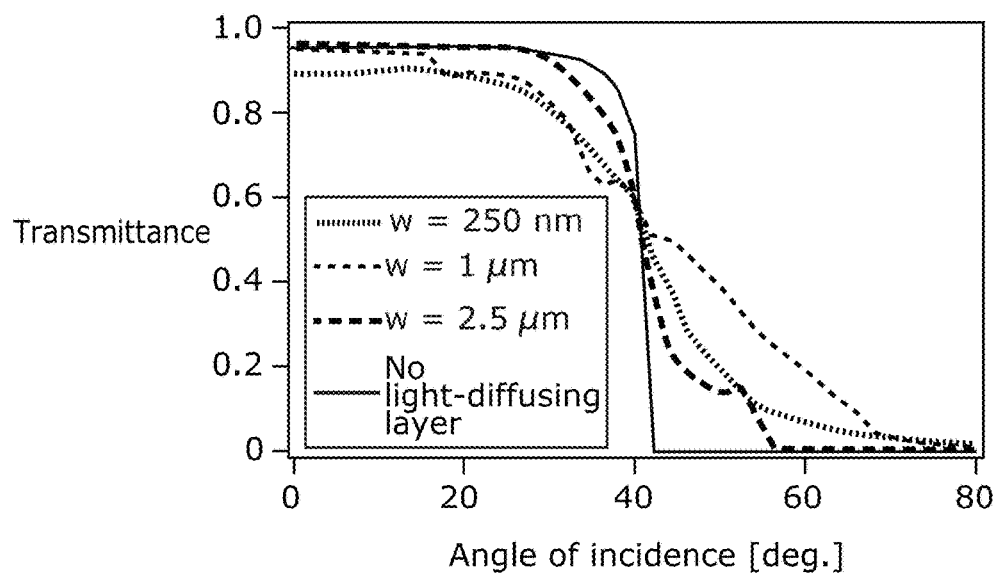
FIG. 6 shows the result of a calculation of the dependency of the transmittance of light by the light-diffusing layer on the angle of incidence.

Next, the dependency of the transmittance of light by the light-diffusing layer 151 according to Embodiment 1 on the angle of incidence was calculated. FIG. 6 shows the result of a calculation of the dependency of the transmittance of light by the light-diffusing layer 151 on the angle of incidence. In FIG. 6, the angle of incidence of light incident on the light-diffusing layer 151 is represented on the horizontal axis, and the transmittance of light passing through the light-diffusing layer 151 is represented on the vertical axis. With the configuration illustrated in FIG. 1 and FIG. 2A, conditions for the calculation were set as follows. The refractive index of the first microscopic region 154 and the refractive index of the light-transmissive substrate 14 were each set to 1.5, the refractive index of the second microscopic region 155 and the refractive index of the atmospheric layer 16 were each set to 1.0, and the height h of the first microscopic region 154 (the protrusion 154a) was set to 1.0 μm. In FIG. 6, the graphs represented by the three dashed lines show the calculation results when the unit size w of the first microscopic region 154 and the second microscopic region 155 was 250 nm, 1 μm, and 2.5 μm. It should be noted that the graph represented by solid line shows the calculation result when the light-diffusing layer 151 was not provided. As can be understood from FIG. 6, the transmittance of light incident at angles above the critical angle of approximately 42° was 0 when the light-diffusing layer 151 was not provided, while the transmittance of light incident at angles above the critical angle of approximately 42° was greater than 0 when the light-diffusing layer 151 was provided. From this it can be understood that by providing the light-diffusing layer 151 according to Embodiment 1, light incident on the light-diffusing layer 151 at an angle of incidence greater than the critical angle can be more efficiently extracted out.

Figure 7:
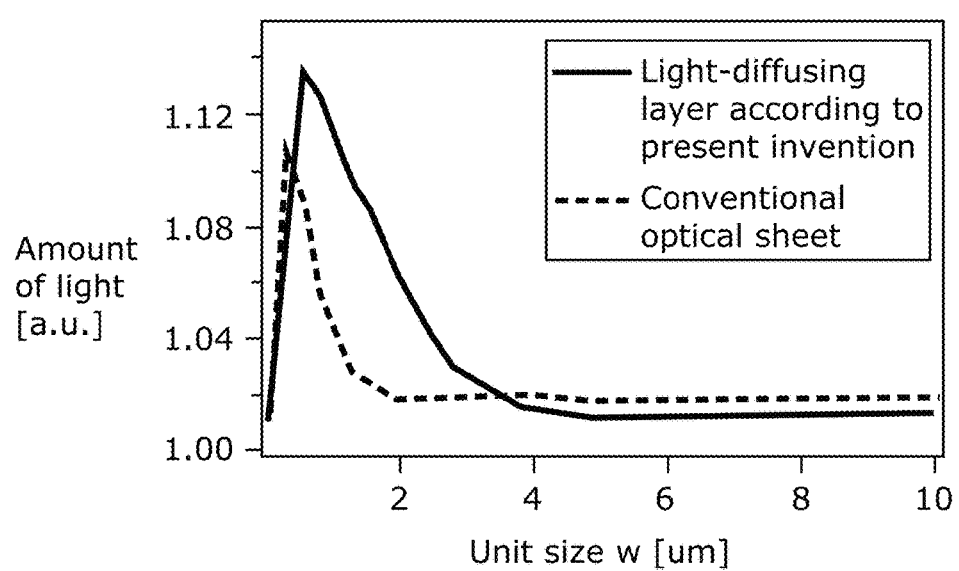
FIG. 7 shows the result of a calculation of the dependency of the total amount of light transmitted to the atmospheric layer from the light-diffusing layer on the unit size w of each of the first microscopic regions and the second microscopic regions.

Next, the dependency of the total amount of light transmitted to the atmospheric layer 16 from the light-diffusing layer 151 on the unit size w of each of the first microscopic regions 154 and the second microscopic regions 155 when the light in the light-transmissive substrate 14 is isotropic was calculated. FIG. 7 shows the result of a calculation of the dependency of the total amount of light transmitted to the atmospheric layer 16 from the light-diffusing layer 151 on the unit size w of each of the first microscopic regions 154 and the second microscopic regions 155. In FIG. 7, the unit size w of each of the first microscopic regions 154 and the second microscopic regions 155 is represented on the horizontal axis, and the total amount of light transmitted to the atmospheric layer 16 from the light-diffusing layer 151 is represented on the vertical axis. With the configuration illustrated in FIG. 1 and FIG. 2A, conditions for the calculation were set as follows. The refractive index of the first microscopic region 154 and the refractive index of the light-transmissive substrate 14 were each set to 1.5, and the refractive index of the second microscopic region 155 and the refractive index of the atmospheric layer 16 were each set to 1.0. In FIG. 7, the graph represented by the solid line shows the calculation result with the light-diffusing layer 151 according to Embodiment 1. It should be noted that the graph represented by the dashed line shows the calculation result with the conventional optical sheet 60. As can be understood from FIG. 7, in the range of unit size w from 100 nm to 250 nm, the light-diffusing layer 151 according to Embodiment 1 achieved roughly the same light extraction efficiency as the conventional optical sheet 60, and in the range of unit size w from 250 nm to 4 μm, the light-diffusing layer 151 according to Embodiment 1 achieved a greater light extraction efficiency than the conventional optical sheet 60.

Figure 8A:
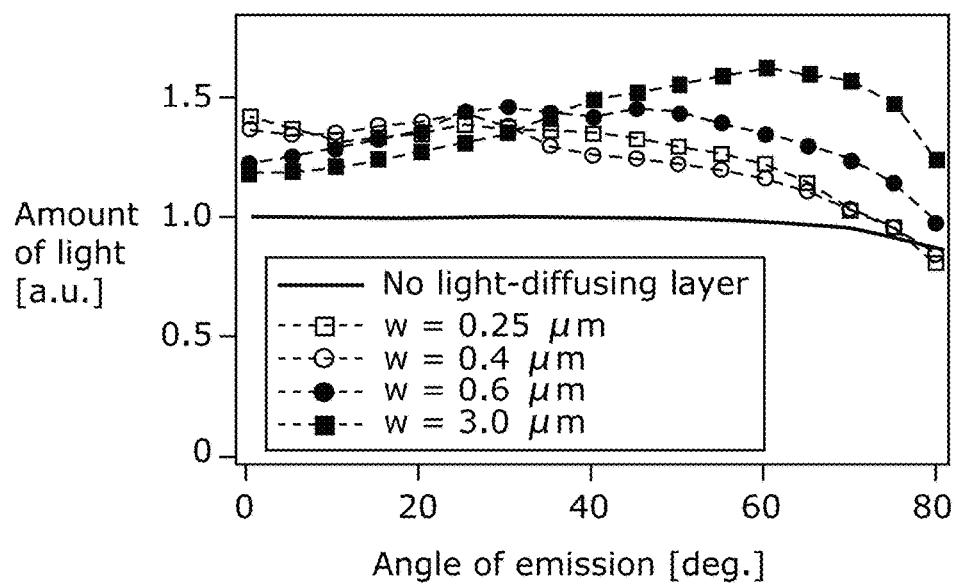
FIG. 8A shows the result of a calculation of the dependency of the total amount of light transmitted to the atmospheric layer from the light-diffusing layer according to Embodiment 1 on the angle of emission.

Next, the dependency of the total amount of light transmitted to the atmospheric layer 16 from the light-diffusing layer 151 on the angle of emission when the light in the light-transmissive substrate 14 is isotropic was calculated. FIG. 8A shows the result of a calculation of the dependency of the total amount of light transmitted to the atmospheric layer 16 from the light-diffusing layer 151 on the angle of emission. In FIG. 8A, the angle of emission of light from the light-diffusing layer 151 is represented on the horizontal axis, and the total amount of light transmitted to the atmospheric layer 16 from the light-diffusing layer 151 is represented on the vertical axis. With the configuration illustrated in FIG. 1 and FIG. 2A, conditions for the calculation were set as follows. The refractive index of the first microscopic region 154 and the refractive index of the light-transmissive substrate 14 were each set to 1.5, and the refractive index of the second microscopic region 155 and the refractive index of the atmospheric layer 16 were each set to 1.0. In FIG. 8A, the graphs represented by the four dashed lines show the calculation results when the unit size w of the first microscopic region 154 and the second microscopic region 155 of the light-diffusing layer 151 according to Embodiment 1 was 0.25 μm, 0.4 μm, 0.6 μm, and 3.0 μm. It should be noted that the graph represented by solid line shows the calculation result when the light-diffusing layer 151 is not provided.

Figure 8B:
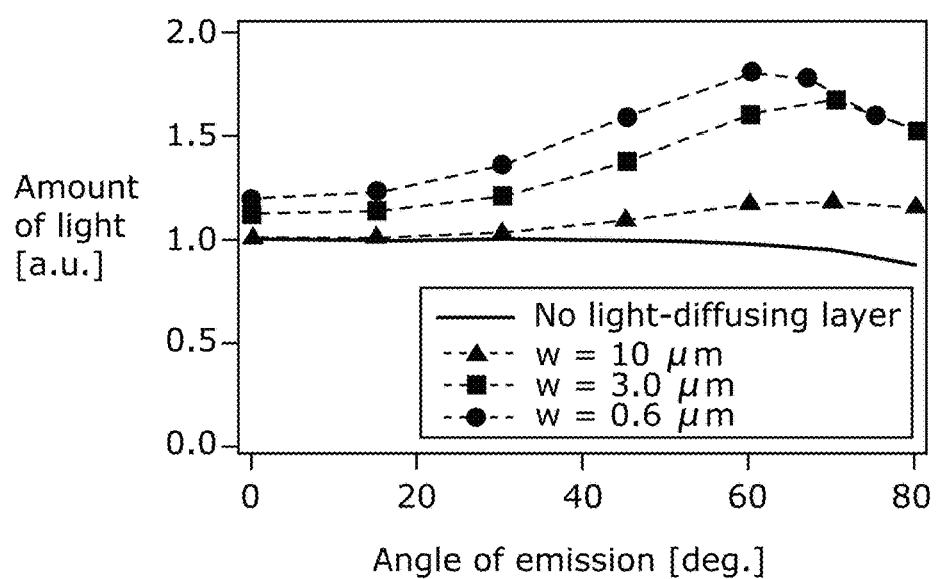
FIG. 8B shows the result of a calculation of the dependency of the total amount of light transmitted to the atmospheric layer from a conventional optical sheet on the angle of emission.

In contrast, FIG. 8B shows the result of a calculation of the dependency of the total amount of light transmitted to the atmospheric layer from the conventional optical sheet 60 on the angle of emission. In FIG. 8B, the graphs represented by the three dashed lines show the calculation results when the unit size of the first microscopic region 601 and the second microscopic region 602 of the conventional optical sheet 60 was 0.6 μm, 3.0 μm, and 10 μm. As can be understood from FIG. 8A and FIG. 8B, with the conventional optical sheet 60, the majority of the light is extracted on the wide-angle side (in other words, in directions having a relatively large angle of emission), while with the light-diffusing layer 151 according to Embodiment 1, the majority of the light is extracted to the frontward side (in other words, in directions having a relatively small angle of emission) in the range of unit size w from 0.25 μm (250 nm) to 0.6 μm.

From this, it can be understood that, to improve the light extraction efficiency in the pattern of the light-diffusing layer 151 according to Embodiment 1, the unit size w is ideally 100 nm to 4 μm, and even more ideally 250 nm to 4 μm. Furthermore, to improve the light extraction efficiency and to cause the light to be extracted in a more forward direction, the unit size w is ideally 250 nm to 0.6 μm. It should be noted that this unit size w range is a numerical range for when the wavelength of the light is 550 nm. Since diffusion of the light in the light-diffusing layer 151 occurs according to the diffraction phenomenon, the range of the unit size w is proportional to the wavelength of light. As such, to improve the light extraction efficiency when the central light emission wavelength is λ, the unit size w is ideally 0.18λ to 7.3λ, and even more ideally 0.45λ to 7.3λ. Furthermore, to improve the light extraction efficiency and to cause the light to be emitted in a more forward direction, the unit size w is ideally 0.45λ to 1.1λ. It should be noted that the central light emission wavelength λ refers to a wavelength where a sum of the optical intensity of greater wavelengths is equal to a sum of the optical intensity of lesser wavelengths.

[Advantageous Effect]

As described above, the spatial frequency of the pattern of the light-diffusing layer 151 according to Embodiment 1 peaks at a spatial frequency in the vicinity of 1/(2w). Furthermore, among spatial frequency components of this pattern, high spatial frequencies in the vicinity of 1/w and low spatial frequencies in the vicinity of 0 are kept to a minimum. In other words, the spatial frequency component of this pattern has a peak-and-valley magnitude distribution wherein spatial frequencies in the vicinities of 1/w and 0 are kept to a minimum and spatial frequencies in the vicinity of 1/(2w) are at the peak. This magnitude distribution curve has a half bandwidth of around 1/(2w), for example. With this, it is possible to transform more of the light incident on the light-diffusing layer 151 into diffuse light, and it is possible to keep, among diffuse light emitting from the light-diffusing layer 151, the diffuse light that is emitted in the vicinity of the emission direction of non-diffused (zeroth order) light to a minimum. It should be noted that this magnitude distribution curve preferably has a light-emitting element light-emitting wavelength spectrum width of Δλ or greater in the vicinity of the peak component 1/(2w). In other words, it preferably has a width of 1/(2w±Δλ/2) or greater. With this, light of different wavelengths generated by the light-emitting element can be extracted.

When the central light emission wavelength of light incident on the light-diffusing layer 151 is λ, the unit size w of each of the first microscopic region 154 and the second microscopic region 155 is ideally 0.18λ to 7.3λ, and even more ideally 0.45λ to 7.3λ. As such, conditions for the spatial frequency of the above described pattern can be expressed as follows using central light emission wavelength λ. In other words, regarding the pattern according to Embodiment 1, among spatial frequency components thereof, components in the vicinity of 0 and components in the vicinity of 1/w are kept to a minimum at the same time, and the range of w is ideally 0.18λ to 7.3λ, and even more ideally 0.45λ to 7.3λ. Moreover, the spatial frequency ideally peaks in the vicinity of ½(w). As such, the spatial frequency ideally peaks between 1/(2×7.3λ)=0.068/λ and 1/(2×0.18λ)=2.8/λ, inclusive, and even more ideally peaks between 1/(2×7.3λ)=0.068/λ and 1/(2×0.45λ)=1.3/λ, inclusive.

It should be noted that when the refractive index of the light-transmissive substrate 14 is $n_1$ and the refractive index of the atmospheric layer 16 is $n_0$, conditions for the spatial frequency of the above described pattern can be expressed as follows. When light travels from a medium with a refractive index $n_1$ to a medium with a refractive index $n_0$ and light is diffracted at the spatial frequency 1/w, the following Equation 2 is satisfied, where the angle of incidence of light is $\theta_1$ and the angle of emission of light is $\theta_0$.

[MATH 2]

$$w(n_0 \sin \theta_0 - n_1 \sin \theta_1) = m\lambda \quad \text{Equation 2}$$

In Equation 2, m is an integer and λ is the wavelength of the light. By transforming the above Equation 1, the following Equation 3 can be formed.

[MATH 3]

$$\sin \theta_0 = (m\lambda/w + n_1 \sin \theta_1)/n_0 \quad \text{Equation 3}$$

In Equation 3, when the angle of emission $\theta_0$ has no solution, the angle of emission $\theta_0$ of light does not change—that is to say, the light does not diffract (diffuse). When Equation 3 does not include the right side first term of Equation 2, Equation 3 is nothing more or less than Snell's law, meaning it is the same as if the light-diffusing layer 151 were not provided. When the value of λ/w, which is proportional to the spatial frequency component, is sufficiently small (in other words, when the unit size w is sufficiently large), the right side first term of Equation 3 becomes a sufficiently small value, meaning it is the same as if the light-diffusing layer 151 were not provided. Moreover, when the value of λ/w is sufficiently large (in other words, when the unit size w is sufficiently small), the right side first term of Equation 3 becomes a sufficiently large value, so the angle of emission $\theta_0$ does not have a solution other than when m=0. Consequently, even this case is approximately the same as if the light-diffusing layer 151 were not provided.

Consequently, it can be said that the pattern of the light-diffusing layer 151 according to Embodiment 1 is a diffusing structure that can more effectively transform the angle of emission $\theta_0$ of light by keeping sufficiently large spatial frequencies and sufficiently small spatial frequencies to a minimum.

As can be understood from Equation 2, the angle of emission $\theta_0$ is dependent on the refractive index $n_0$ of the atmospheric layer 16. Since the angle of emission $\theta_0$ is approximately inversely proportional to the refractive index $n_0$ of the atmospheric layer 16, conditions for the spatial frequency of the above described pattern can be expressed as follows. In other words, regarding the pattern, among spatial frequency components thereof, components in the vicinity of 0 and components in the vicinity of 1/w are kept to a minimum at the same time, and the range of w is ideally $0.18n_0 \times \lambda$ to $7.3n_0 \times \theta$, and even more ideally $0.45n_0 \times \lambda$ to $7.3n_0 \times \lambda$. Moreover, the spatial frequency ideally peaks in the vicinity of ½(w). As such, the spatial frequency ideally peaks between $1/(2 \times 7.3n_0\lambda) = 0.068/(n_0 \times \lambda)$ and $1/(2 \times 0.18n_0\lambda) = 2.8/(n_0 \times \lambda)$, inclusive, and even more ideally peaks between $1/(2 \times 7.3n_0\lambda) = 0.068/(n_0 \times \lambda)$ and $1/(2 \times 0.45n_0\lambda) = 1.3/(n_0 \times \lambda)$, inclusive.

[Probability of Appearance of the First Unit Structure and the Second Unit Structure]

Figure 9:
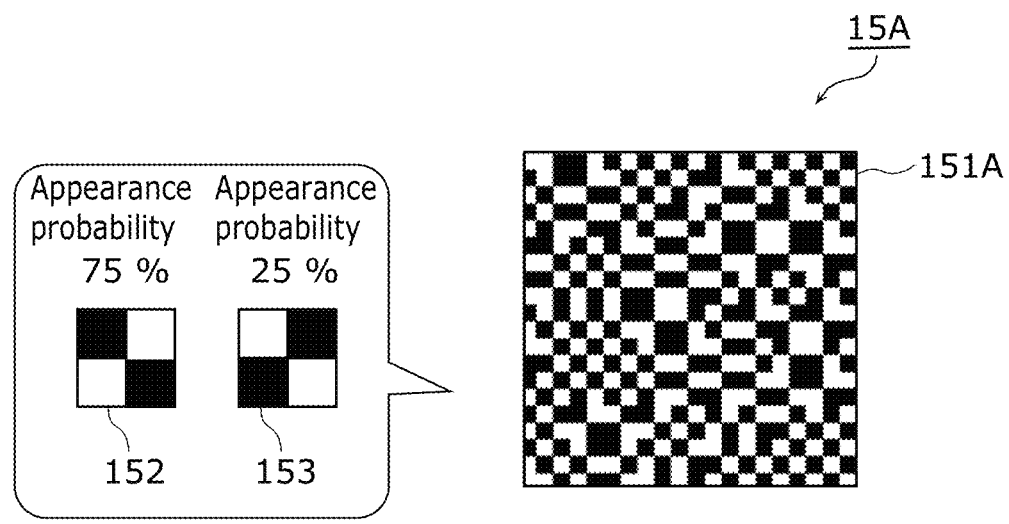
FIG. 9 is a planar view of the optical sheet when the probability of appearance of the first unit structure and the second unit structure is 75% and 25%, respectively.
Figure 10:
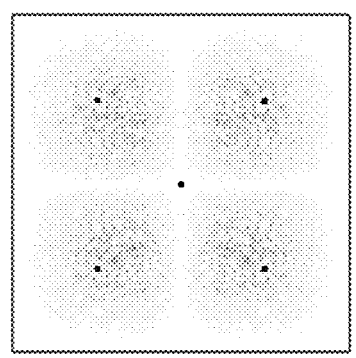
FIG. 10 shows the amplitude of the spatial frequency component of the Fourier transformed pattern of the light-diffusing layer illustrated in FIG. 9.

FIG. 9 is a planar view of the optical sheet 15A when the probability of appearance of the first unit structure 152 and the second unit structure 153 is 75% and 25%, respectively. FIG. 10 shows the amplitude of the spatial frequency component of the Fourier transformed pattern of the light-diffusing layer 151A illustrated in FIG. 9.

When a plurality of the first unit structures 152 and the second unit structures 153 are arranged randomly using the above probability of appearance, a randomness component appears, and a periodic component appears since the first unit structure 152, which has a high probability of appearance, appears periodically. For this reason, as FIG. 10 illustrates, diffuse light based on the randomness component and non-diffused light (first order light) based on the periodic component coexist in the light emitting from the light-diffusing layer 151A.

Figure 11A:
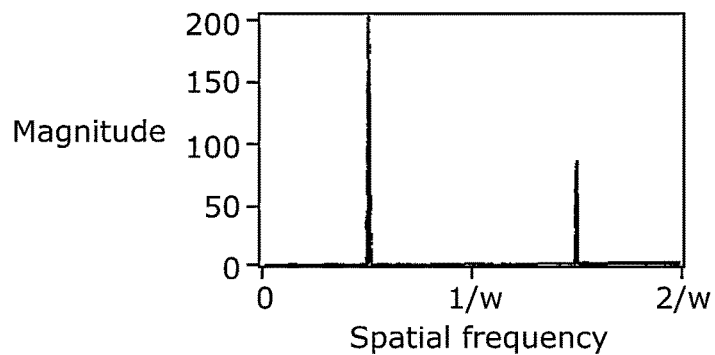
FIG. 11A shows a one-dimensional distribution in one azimuth among the spatial frequencies obtained through Fourier transform of the pattern when the probability of appearance of the first unit structure is 100%.
Figure 11B:
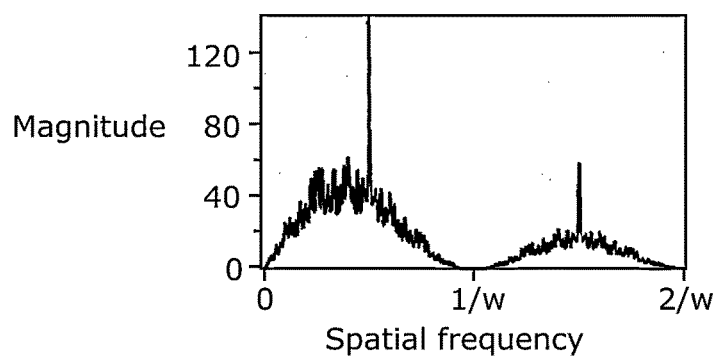
FIG. 11B shows a one-dimensional distribution in one azimuth among the spatial frequencies obtained through Fourier transform of the pattern when the probability of appearance of the first unit structure is 80%.
Figure 11C:
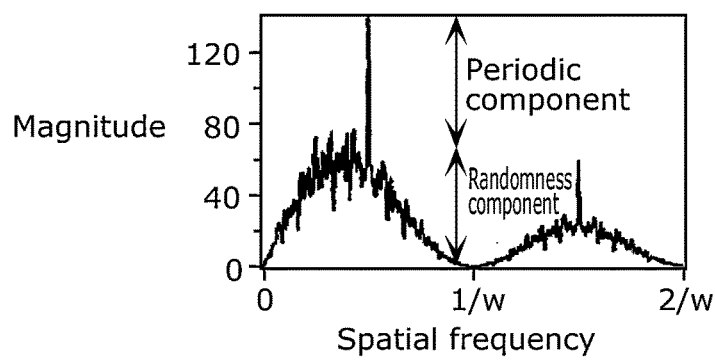
FIG. 11C shows a one-dimensional distribution in one azimuth among the spatial frequencies obtained through Fourier transform of the pattern when the probability of appearance of the first unit structure is 70%.
Figure 11D:
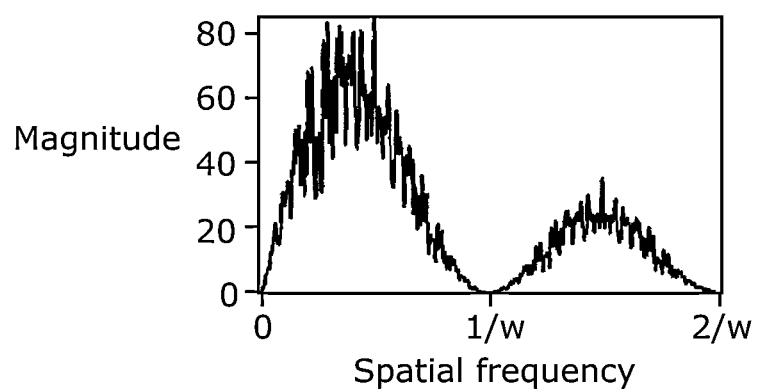
FIG. 11D shows a one-dimensional distribution in one azimuth among the spatial frequencies obtained through Fourier transform of the pattern when the probability of appearance of the first unit structure is 60%.
Figure 11E:
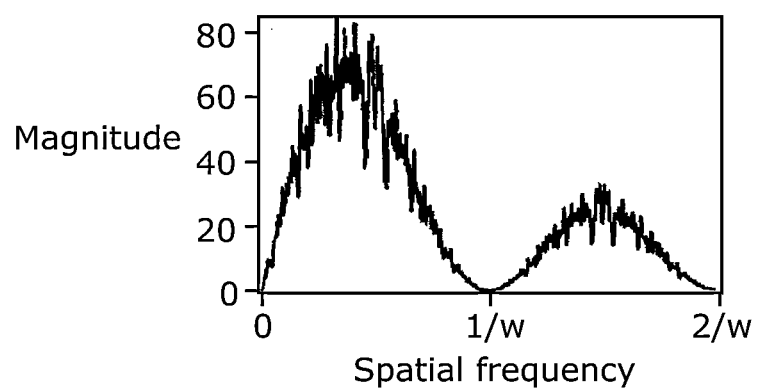
FIG. 11E shows a one-dimensional distribution in one azimuth among the spatial frequencies obtained through Fourier transform of the pattern when the probability of appearance of the first unit structure is 50%.

FIG. 11A through FIG. 11E show one-dimensional distributions in one azimuth among the spatial frequencies obtained through Fourier transform of the pattern, when the probability of appearance of the first unit structure 152 is 100%, 70%, 60%, and 50%, respectively. When the probability of appearance of the first unit structure 152 is 100%, since the periodic component strongly appears, the spatial frequency of the pattern sharply peaks in the spatial frequency components corresponding to the periods, and for the most part does not include other components, as FIG. 11A illustrates. When the probability of appearance of the first unit structure 152 is 50%, the spatial frequency of the pattern does not include a sharp peak, as FIG. 11E illustrates. Moreover, a peak-and-valley magnitude distribution which gradually transitions (so as to have width) is present in the range from the vicinity of 0 to the vicinity of 1/w. This shows that the randomness component strongly appears. When the probability of appearance of the first unit structure 152 is 60%, the periodic component appears in principle, but the spatial frequency of the pattern for the most part does not include a sharp peak, as FIG. 11D illustrates. However, when the probability of appearance of the first unit structure 152 is 80% and 70%, since the periodic component stands out, the spatial frequency of the pattern has both a gradually transitioning (so as to have width) mountainous shape and a sharp peak caused by the periodic component, as FIG. 11B and FIG. 11C illustrate.

For example, assume the probability of appearance of the first unit structure 152 is x % and the probability of appearance of the second unit structure 153 is y % (where x>y). In this case, y % of the first unit structure 152 has a pair in y % of the second unit structure 153, so the y % is a randomness component, but (x−y) % of the first unit structure 152 does not have a pair in the second unit structure 153, so the (x−y) % is a periodic component. In other words, when the probability of appearance of the first unit structure 152 is x % and the probability of appearance of the second unit structure 153 is y %, y % of the first unit structure 152 is the randomness component, and (x−y) % of the first unit structure 152 is the periodic component. Consequently, the condition that makes the randomness component dominant is "y>x−y". When "x+y=10%", the above condition is "x<66.6%". As is illustrated in FIG. 11D, when the probability of appearance of the first unit structure 152 is 60%, the condition is almost completely the random component, but as is illustrated in FIG. 11C, when the probability of appearance of the first unit structure 152 is 70%, the condition is the same as when periodic component clearly appears.

As described above, by analyzing the spatial frequency component of the pattern, it is possible to determine whether the randomness component is dominant or not. For example, in the spatial frequency spectrum of a given pattern, when the amplitude of the magnitude distribution arising from the randomness is greater than the amplitude of the frequency component arising from the periodic nature, it is possible to deduce that the randomness component in that pattern is dominant. In the pattern of the light-diffusing layer 151 according to Embodiment 1, the randomness component is dominant.

[Protrusion Height]

Figure 12:
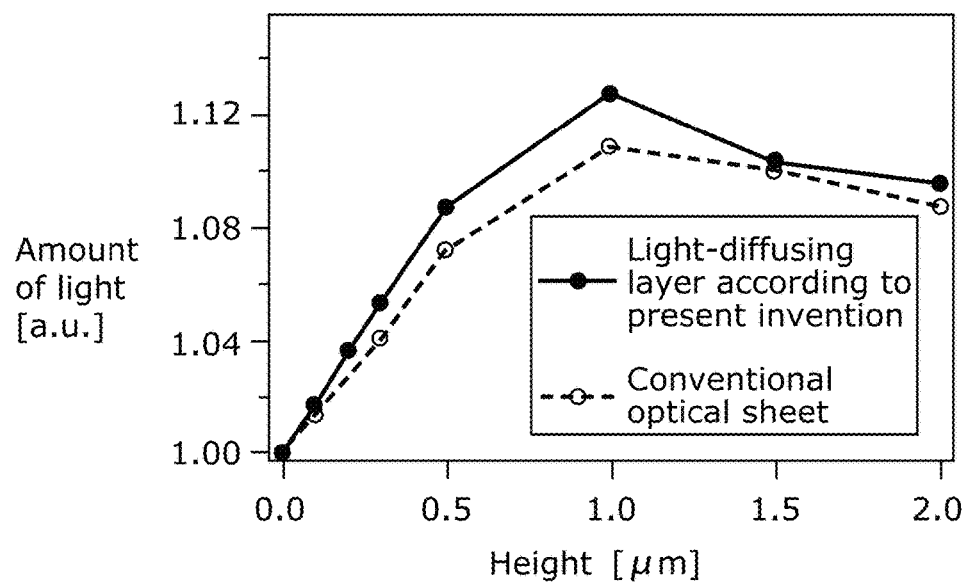
FIG. 12 shows the result of a calculation of the dependency of the total amount of light transmitted to the atmospheric layer from the light-diffusing layer on the height h of each of the plurality of protrusions.

FIG. 12 shows the result of a calculation of the dependency of the total amount of light transmitted to the atmospheric layer 16 from the light-diffusing layer 151 on the height h of each of the plurality of protrusions 154a. In FIG. 12, the height h of each of the plurality of protrusions 154a relative to the plurality of recesses 155a is represented on the horizontal axis, while the total amount of light transmitted to the atmospheric layer 16 from the light-diffusing layer 151 is represented on the vertical axis. With the configuration illustrated in FIG. 1 and FIG. 2A, conditions for the calculation were set as follows. The refractive index of the first microscopic region 154 and the refractive index of the light-transmissive substrate 14 were each set to 1.5, the refractive index of the second microscopic region 155 and the refractive index of the atmospheric layer 16 were each set to 1.0, and the unit size w of each of the first microscopic regions 154 and second microscopic regions 155 was set to 1 μm. In FIG. 12, the graph represented by the solid line shows the calculation result with the light-diffusing layer 151 according to Embodiment 1. It should be noted that the graph represented by the dashed line shows the calculation result with the conventional optical sheet 60.

As can be understood from FIG. 12, in the range of height h from 1.5 μm and less, the light-diffusing layer 151 according to Embodiment 1 achieved a greater light extraction efficiency than the conventional optical sheet. Consequently, a height h of each of the protrusions 154a of 1.5 μm or less is ideal. Moreover, when the height h was 0.1 μm or greater, a greater light extraction efficiency than the conventional optical sheet was achieved. Furthermore, when the height h was 0.5 μm or greater, an even greater light extraction efficiency was achieved. Consequently, a height h of each of the protrusions 154a of 0.1 μm or greater is ideal. Moreover, a height h of each of the protrusions 154a of 0.5 μm or greater is even more ideal.

Figure 13:
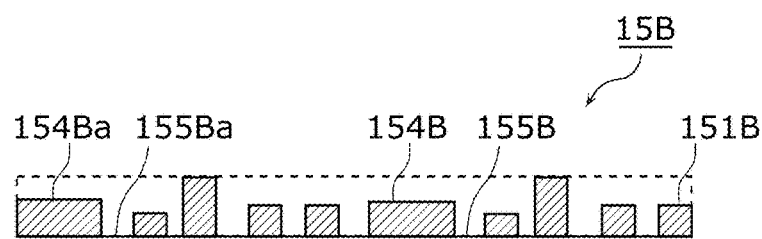
FIG. 13 is a cross sectional view of an optical sheet according to a variation of an embodiment.

It should be noted that with Embodiment 1, the height h of each of the protrusions 154a is constant, but the height of each of the protrusions 154a may be random. FIG. 13 is a cross sectional view of an optical sheet 15B according to a variation of an embodiment. With the optical sheet 15B shown in FIG. 13, the height of each of the protrusions 154Ba relative to the recesses 155Ba is random. When the light passes through the plurality of protrusions 154Ba and the plurality of recesses 155Ba, a phase difference dependent on the heights of the plurality of protrusions 154Ba is generated. Here, the average phase difference of the transmitted light is determined by the average height of the protrusions 154Ba. Consequently, even in this case, as long as a sufficient average phase difference is attributed to the transmitted light, the average height of the protrusions 154Ba is ideally 1.5 μm or less.

Variation of Embodiment 1

In this Variation, with the configuration illustrated in FIG. 1 and FIG. 2A, the light that is incident on the light-diffusing layer 151 at angles greater than the critical angle accounts for 50% or more of the total intensity of light incident on the light-diffusing layer 151. In this case, the conditions that the spatial frequency of the pattern of the light-diffusing layer 151 is to meet are as follows.

Figure 14:
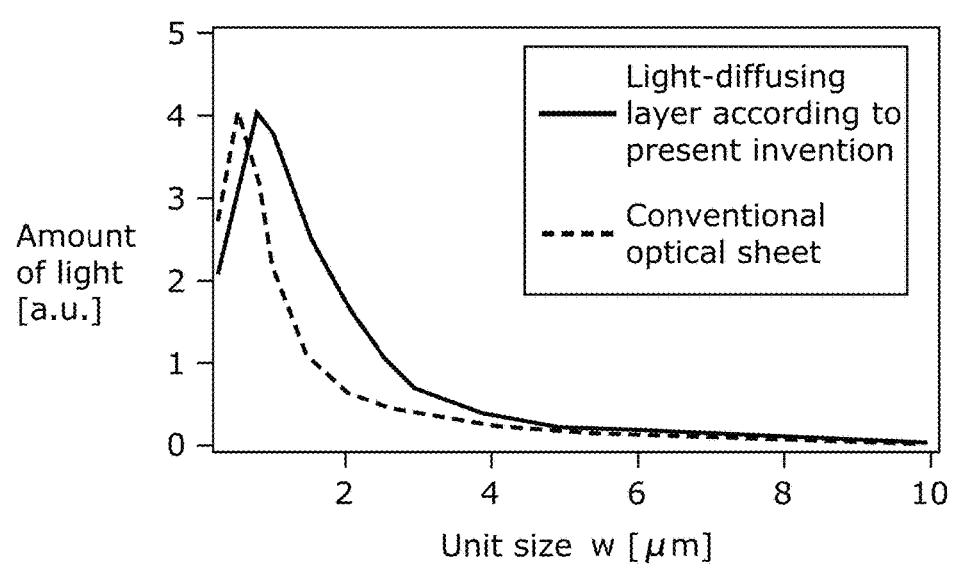
FIG. 14 shows the result of a calculation of the dependency of the total amount of light transmitted to the atmospheric layer from the light-diffusing layer according to a variation of Embodiment 1 on the unit size w of each of the first microscopic regions and the second microscopic regions.

FIG. 14 shows the result of a calculation of the dependency of the total amount of light transmitted to the atmospheric layer 16 from the light-diffusing layer 151 according to the Variation of Embodiment 1 on the unit size w of each of the first microscopic regions 154 and the second microscopic regions 155. Conditions for the calculation were set as follows. The calculation was performed under the assumption that only light traveling at angles greater than the critical angle is present in the light-transmissive substrate 14. The refractive index of the first microscopic region 154 and the refractive index of the light-transmissive substrate 14 were each set to 1.5, and the refractive index of the second microscopic region 155 and the refractive index of the atmospheric layer 16 were each set to 1.0. In FIG. 14, the graph represented by the solid line shows the calculation result with the light-diffusing layer 151 according to Embodiment 1. It should be noted that the graph represented by the dashed line shows the calculation result with the conventional optical sheet 60. As can be understood from FIG. 14, in the range of unit size w from 0.6 μm to 5 μm, the light-diffusing layer 151 according to this Variation of Embodiment 1 achieved a greater light extraction efficiency than the conventional optical sheet 60. When the central light emission wavelength was set to λ, the range of the above-described unit size w was 1.1λ to 9.1λ.

As such, conditions for the spatial frequency of the pattern according to the Variation can be expressed as follows using central light emission wavelength as λ and the refractive index of the atmospheric layer 16, which is on the side to which light is emitted from the light-diffusing layer 151, as n. In other words, regarding the pattern according to this Variation of Embodiment 1, among spatial frequency components thereof, components in the vicinity of 0 and components in the vicinity of 1/w are kept to a minimum at the same time, and the range of w is ideally 1.1n×λ to 9.1n×λ. Moreover, the spatial frequency ideally peaks in the vicinity of ½(w). Consequently, the spatial frequency ideally peaks in the range of $1/(2\times9.1\lambda\times n)=0.055/(\lambda\times n)$ to $1/(2\times1.1\lambda\times n)=0.45/(\lambda\times n)$, inclusive.

Embodiment 2

Figure 15A:
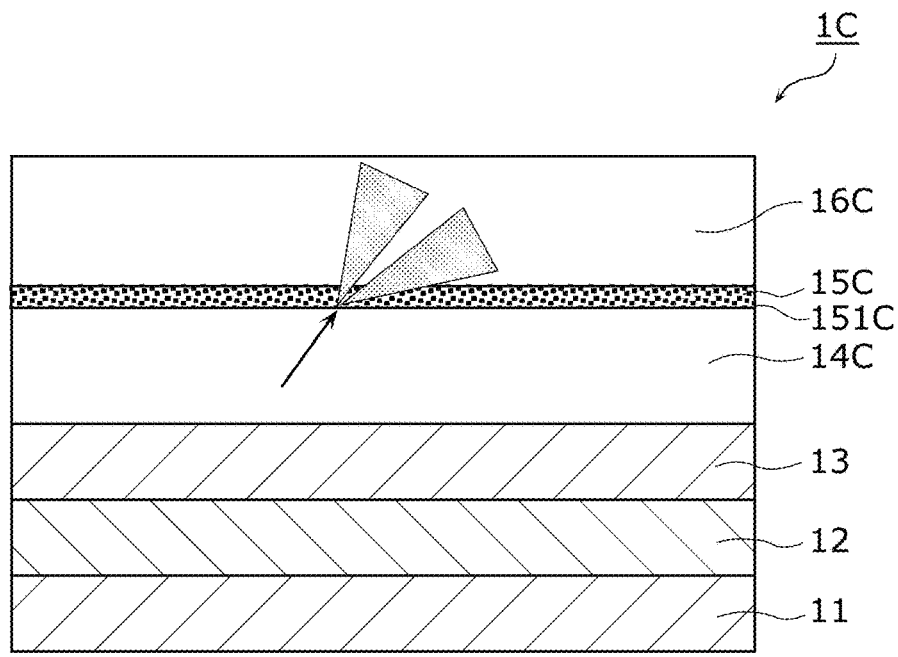
FIG. 15A is a cross sectional view of the light-emitting device according to Embodiment 2.

FIG. 15A is a cross sectional view of a light-emitting device 1C according to Embodiment 2. As is illustrated in FIG. 15A, with the light-emitting device 1C according to Embodiment 2, a protective layer (light-transmissive substrate) 16C is disposed sandwiching a light-diffusing layer 151C with a high refractive index layer 14C. The light-diffusing layer 151C is disposed between the light-emitting layer 12 and the protective layer 16C. The refractive index of the protective layer 16C is, for example, 1.4 to 1.65, and the refractive index of the high refractive index layer 14C is greater than or equal to the refractive index of the protective layer 16C. Material used for the protective layer 16C may be, for example, a light-transmissive material such as glass or resin. Material used for the high refractive index layer 14C may be, for example, indium in oxide (ITO), titanium oxide ($TiO_2$), silicon nitride (SiN), tantalum pentoxide ($Ta_2O_5$), zirconia ($ZrO_2$), and resin. In the light-diffusing layer 151C, the refractive index of the first microscopic region 154 is a high refractive index roughly equal to the refractive index of the high refractive index layer 14C, and material used for the first microscopic region 154 may be, for example, a light-transmissive material such as glass or resin. Moreover, the refractive index of the second microscopic region 155 is roughly equal to the refractive index of the protective layer 16C, and material used for the second microscopic region 155 may be, for example, indium in oxide (ITO), titanium oxide ($TiO_2$), silicon nitride (SiN), tantalum pentoxide ($Ta_2O_5$), zirconia ($ZrO_2$), and resin.

Figure 16:
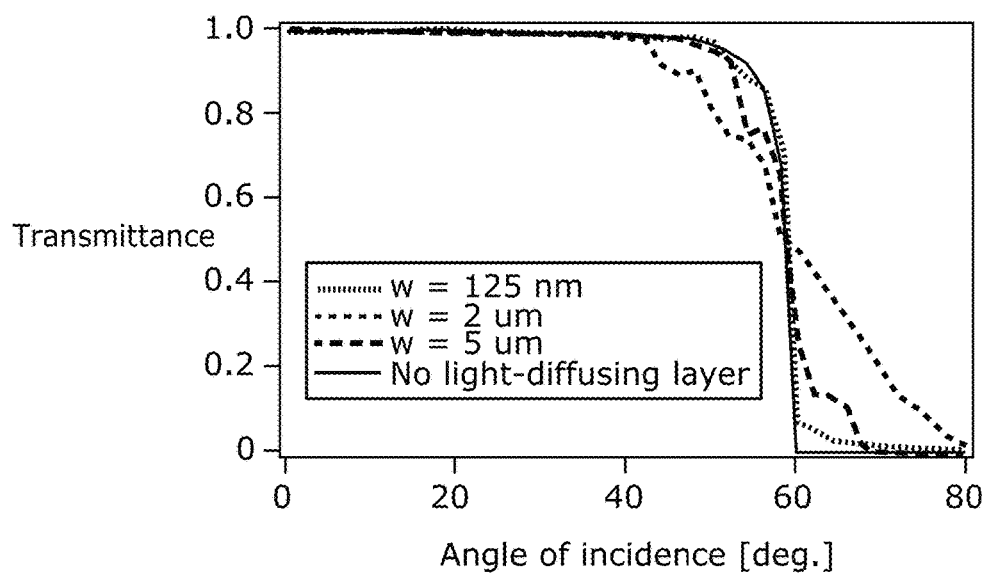
FIG. 16 shows the result of a calculation of the dependency of the transmittance of light by the light-diffusing layer on the angle of incidence.

The dependency of the transmittance of light by the light-diffusing layer 151C according to Embodiment 2 on the angle of incidence was calculated. FIG. 16 shows the result of a calculation of the dependency of the transmittance of light by the light-diffusing layer 151C on the angle of incidence. In FIG. 16, the angle of incidence of light incident on the light-diffusing layer 151C is represented on the horizontal axis, and the transmittance of light passing through the light-diffusing layer 151C is represented on the vertical axis. Conditions for the calculation were set as follows. The refractive index of the first microscopic region 154 and the refractive index of the high refractive index layer 14C were each set to 1.75, the refractive index of the second microscopic region 155 and the refractive index of the protective layer 16C were each set to 1.5, and the height h of the light-diffusing layer 151C was set to 1.0 μm. In FIG. 16, the graphs represented by the three dashed lines show the calculation results when the unit size w of the first microscopic region 154 and the second microscopic region 155 is 125 nm, 2 μm, and 5 μm. It should be noted that the graph represented by solid line shows the calculation result when the light-diffusing layer 151C is not provided. As can be understood from FIG. 16, the transmittance of light incident at angles above the critical angle of approximately 60° was 0 when the light-diffusing layer 151C was not provided, while the transmittance of light incident at angles above the critical angle of approximately 60° was greater than 0 when the light-diffusing layer 151C was provided.

Figure 17:
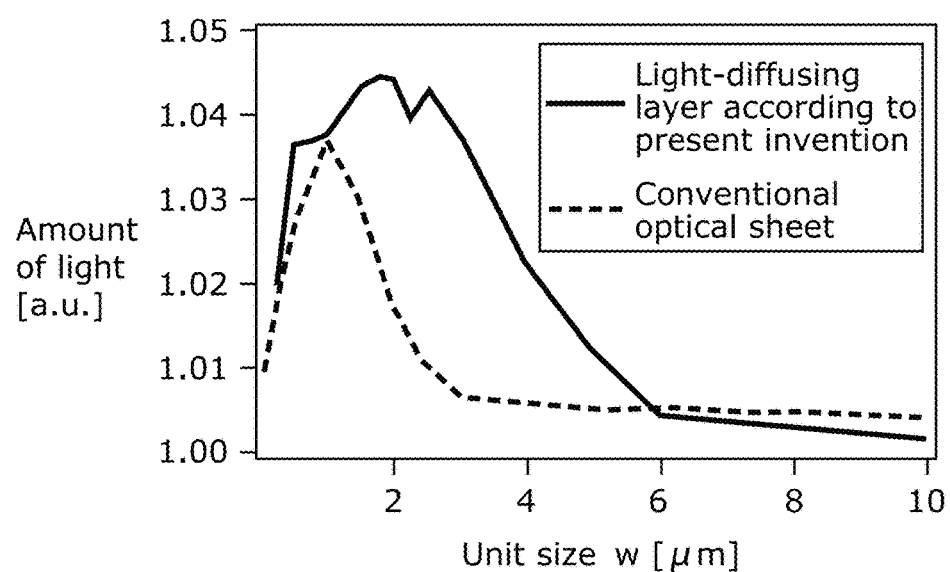
FIG. 17 shows the result of a calculation of the dependency of the total amount of light transmitted to the protective layer from the light-diffusing layer on the unit size w of each of the first microscopic regions and the second microscopic regions when the light in the high refractive index layer is isotropic.

Next, the dependency of the total amount of light transmitted to the protective layer 16C from the light-diffusing layer 151C on the unit size w of each of the first microscopic regions 154 and the second microscopic regions 155 when the light in the high refractive index layer 14C is isotropic was calculated. FIG. 17 shows the result of a calculation of the dependency of the total amount of light transmitted to the protective layer 16C from the light-diffusing layer 151C on the unit size w of each of the first microscopic regions 154 and the second microscopic regions 155 when the light in the high refractive index layer 14C is isotropic. In FIG. 17, the unit size w of each of the first microscopic regions 154 and the second microscopic regions 155 is represented on the horizontal axis, and the total amount of light transmitted to the protective layer 16C from the light-diffusing layer 151C is represented on the vertical axis. Conditions for the calculation were set as follows. The refractive index of the first microscopic region 154 and the refractive index of the high refractive index layer 14C were each set to 1.75, the refractive index of the second microscopic region 155 and the refractive index of the protective layer 16C were each set to 1.5. In FIG. 17, the graph represented by the solid line shows the calculation result with the light-diffusing layer 151C according to Embodiment 2. It should be noted that the graph represented by the dashed line shows the calculation result with the conventional optical sheet 60. As can be understood from FIG. 17, in the range of unit size w from 125 nm to 6 μm, the light-diffusing layer 151C according to Embodiment 2 achieved a greater light extraction efficiency than the conventional optical sheet 60.

Figure 18:
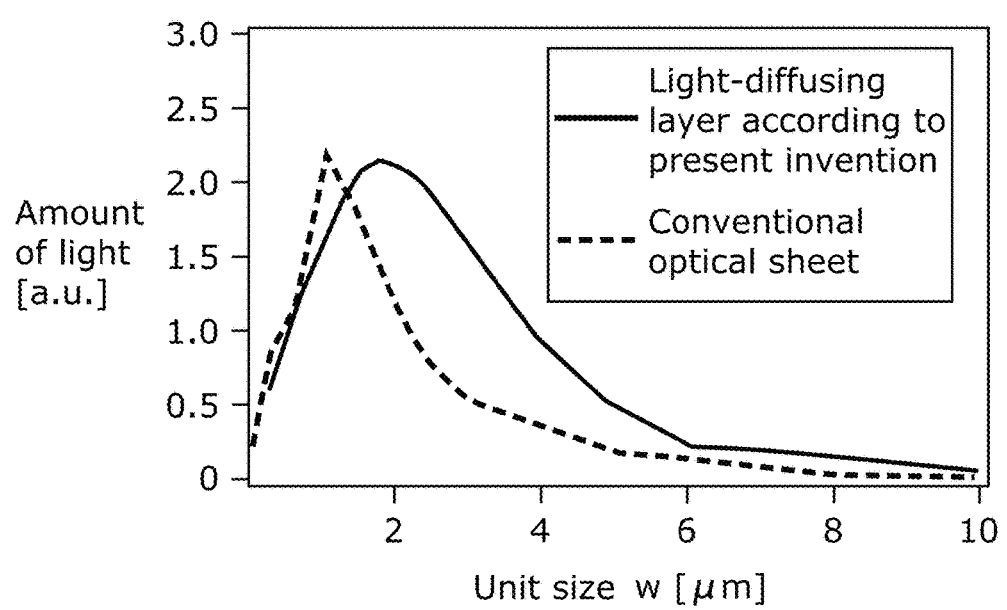
FIG. 18 shows the result of a calculation of the dependency of the total amount of light transmitted to the protective layer from the light-diffusing layer on the unit size w of each of the first microscopic regions and the second microscopic regions when only light traveling at angles greater than the critical angle is present in the high refractive index layer.

Furthermore, the dependency of the total amount of light transmitted to the protective layer 16C from the light-diffusing layer 151C on the unit size w of each of the first microscopic regions 154 and the second microscopic regions 155 when only light traveling at angles greater than the critical angle is present in the high refractive index layer 14C was calculated. FIG. 18 shows the result of a calculation of the dependency of the total amount of light transmitted to the protective layer 16C from the light-diffusing layer 151C on the unit size w of each of the first microscopic regions 154 and the second microscopic regions 155 when only light traveling at angles greater than the critical angle is present in the high refractive index layer 14C. As can be understood from FIG. 18, in the range of unit size w from 1.2 μm and higher, the light-diffusing layer 151C according to Embodiment 2 achieved a greater light extraction efficiency than the conventional optical sheet 60.

From this, it can be understood that, to improve the light extraction efficiency in the pattern of the light-diffusing layer 151C according to Embodiment 2, the unit size w is ideally 125 nm to 6 μm. It should be noted that this unit size w range is a numerical range for when the wavelength of the light is 550 nm. As such, to improve the light extraction efficiency when the central light emission wavelength is λ, the unit size w is ideally 0.23λ to 11λ. As such, conditions for the spatial frequency of the pattern can be expressed as follows where the central light emission wavelength is λ and the refractive index of the protective layer 16C is n. In other words, regarding the pattern according to Embodiment 2, among spatial frequency components thereof, components in the vicinity of 0 and components in the vicinity of 1/w are kept to a minimum at the same time, and the range of w is ideally 0.23n×λ to 11n×λ. Moreover, the spatial frequency ideally peaks in the vicinity of ½(w). Consequently, the spatial frequency ideally peaks in the range of $1/(2\times11\lambda\times n)=0.045/(\lambda\times n)$ to $1/(2\times0.23\lambda\times n)=2.2/(\lambda\times n)$, inclusive.

[Method for Manufacturing and Configuration of Light-Diffusing Layer]

Figure 15B:
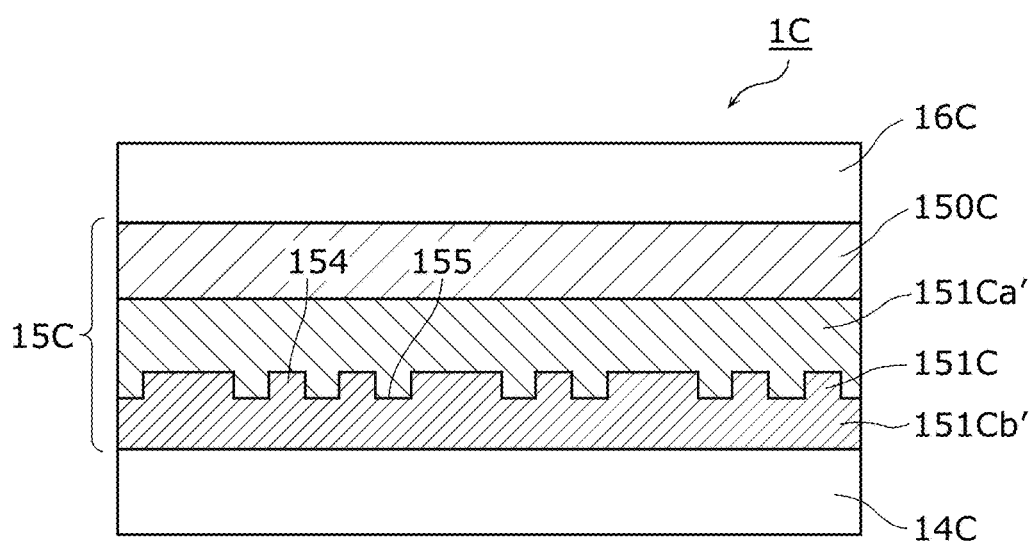
FIG. 15B is an enlarged cross sectional view of a portion of the light-emitting device shown in FIG. 15A.

FIG. 15B is an enlarged cross sectional view of a portion of the light-emitting device 1C shown in FIG. 15A. As is illustrated in FIG. 15B, when the light-diffusing layer 151C is formed inside the light-emitting device 1C, it is possible to form the first microscopic region 154 and the residual film portion 151Cb' by filling the recesses and protrusions with resin having a higher refractive index than the second microscopic region 155 after applying a sheet member (configured of the substrate 150C, the residual film portion 151Ca', and the second microscopic region 155) to the surface of the protective layer 16C.

Alternatively, it is possible to form the first microscopic region 154 and the residual film portion 151Cb' by filling the recesses and protrusions with resin having a higher refractive index than the second microscopic region 155 after forming the residual film portion 151Ca' and the second microscopic region 155 on the surface of the protective layer 16C. In this case, the high refractive index layer 14C is not required, and the light-transmissive electrode 13 may be formed on the surface of the residual film portion 151Cb'.

Alternatively, it is possible to form the second microscopic region 155 and the residual film portion 151Ca' by filling the recesses and protrusions with resin having a different refractive index after forming the first microscopic region 154 and the residual film portion 151Cb' on the surface of the high refractive index layer 14C. In this case, the substrate 150C is not necessary.

Moreover, when the substrate 150 itself is directly worked on, it is possible to have a configuration in which the residual film portion 151Ca' and the residual film portion 151Cb' are omitted.

It should be noted that in Embodiment 2, components required for the forming of the recesses and protrusions, such as the substrate 150C, the residual film portion 151Ca', the residual film portion 151Cb', the first microscopic region 154, and the second microscopic region 155 (or only a few of these) are collectively referred to as the light-diffusing layer 151C.

Since total internal reflection of light is kept to a minimum in the light-diffusing layer 151C and the advantageous effect of improving the efficiency of light extraction is achieved with any of the above configurations, these configurations are included in the scope of the present invention.

It should be noted that when the refractive indices of the first microscopic region 154, the residual film portion 151Cb', and the high refractive index layer 14C are greater than the refractive indices of the second microscopic region 155 and the residual film portion 151Ca', total internal reflection of light is kept to a minimum by the light-diffusing layer 151C and the advantageous effect of improving the efficiency of light extraction is achieved. Material used for the substrate 150C, the first microscopic region 154, and the residual film portion 151Ca' may be, for example, a light-transmissive material such as glass or resin. Material used for the second microscopic region 155 and the residual film portion 151Cb' may be, for example, a light refractive index glass or resin, or a light-transmissive material such as an inorganic material (ITO, $TiO_2$, SiN, $Ta_2O_5$, $ZrO_2$, etc.).

Embodiment 3

Figure 19A:
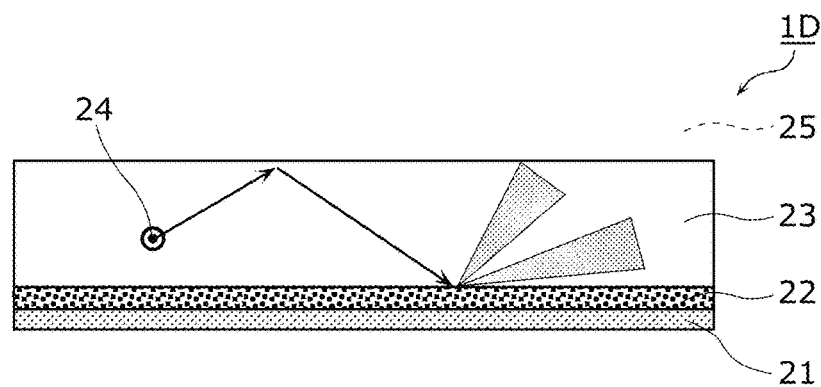
FIG. 19A is a cross sectional view of the light-emitting device according to Embodiment 3.

FIG. 19A is a cross sectional view of a light-emitting device 1D according to Embodiment 3. As is illustrated in FIG. 19A, the light-emitting device 1D according to Embodiment 3 includes a reflective layer 21, an optical sheet 22, a light-transmissive substrate 23, and a light-emitting unit 24. The light-emitting unit 24 is, for example, disposed inside the light-transmissive substrate 23. The optical sheet 22 is disposed between the reflective layer 21 and the light-emitting unit 24, and, for example, has the same configuration as the optical sheet 15 (15A through 15C) described in Embodiments 1 and 2. It should be noted that the light-emitting device 1D may be configured to include a light-diffusing layer instead of the optical sheet 22.

Among light emitted from the light-emitting unit 24, light traveling at angles greater than the critical angle is totally internally reflected at the boundary between the light-transmissive substrate 23 and an external layer 25. Totally internally reflected light such as this is diffused by diffraction in the optical sheet 22 after reflecting off the reflective layer 21. Since diffuse light from the optical sheet 22 travels at angles less than the critical angle, it is extracted to the external layer 25 after passing through the light-transmissive substrate 23.

Consequently, with Embodiment 3, it is possible to keep light from being enclosed in the light-transmissive substrate 23 as a result of total internal reflection of the light emitted by the light-emitting unit 24.

It should be noted that in Embodiment 3, the light-emitting unit 24 is disposed inside the light-transmissive substrate 23, but the embodiment is not limited to this example. For example, the light-emitting unit 24 may be disposed outside of the light-transmissive substrate 23.

Variation of Embodiment 3

Figure 19B:
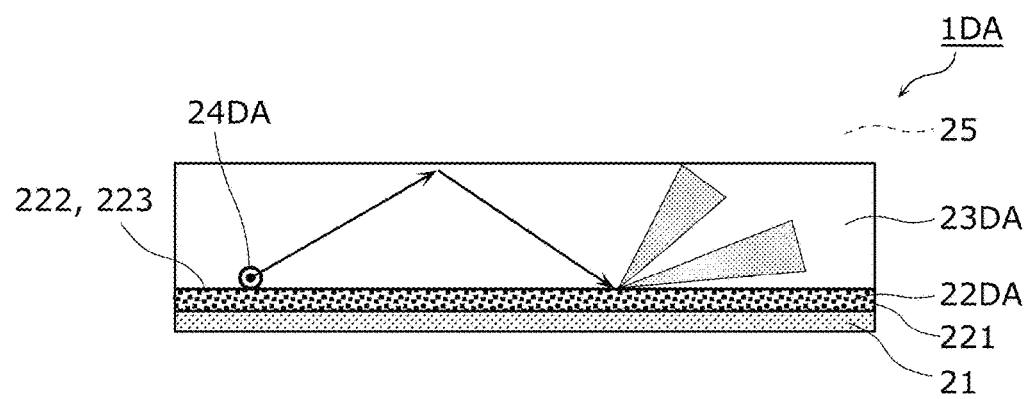
FIG. 19B is a cross sectional view of the light-emitting device according to a variation of Embodiment 3.

FIG. 19B is a cross sectional view of a light-emitting device 1DA according to a Variation of Embodiment 3. As is illustrated in FIG. 19B, with the light-emitting device 1DA according to this Variation, a light-emitting unit 24DA is disposed in a light-transmissive substrate 23DA such that it is in contact with an optical sheet 22DA. It should be noted that the light-transmissive substrate 23DA is disposed such that it is in contact with the optical sheet 22DA, similar to in Embodiment 3.

The optical sheet 22DA includes a light-diffusing layer 221. The light-diffusing layer 221 includes, for example, a plurality of protrusions 222 (plurality of first microscopic regions) and a plurality of recesses 223 (plurality of second microscopic regions), similar to the above described Embodiments 1 and 2.

The spatial frequency component obtained by Fourier transform of numerical data representing a height distribution of the protrusions 222 in the light-diffusing layer 221 according to this Variation can be expressed as follows where λ is the central light emission wavelength and n is the refractive index of the external layer 25, which is adjacent to the side of the light-diffusing layer 221 from which light is emitted. In other words, it is possible to form a configuration in which this spatial frequency component peaks between 0.068/(λ×n) and 2.8/(λ×n), inclusive.

Embodiment 4

Optical Sheet Configuration

Figure 20A:
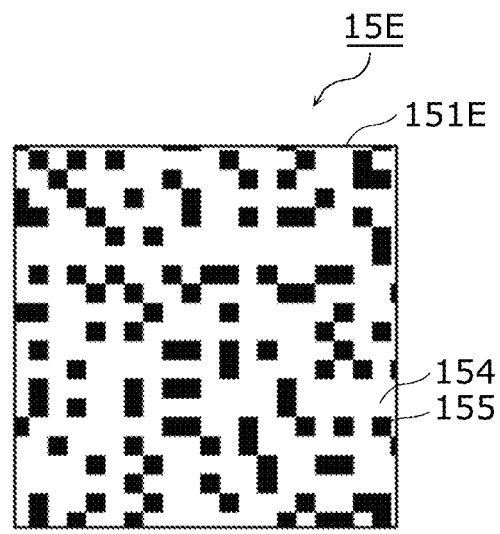
FIG. 20A is a planar view of the optical sheet according to Embodiment 4.
Figure 20B:
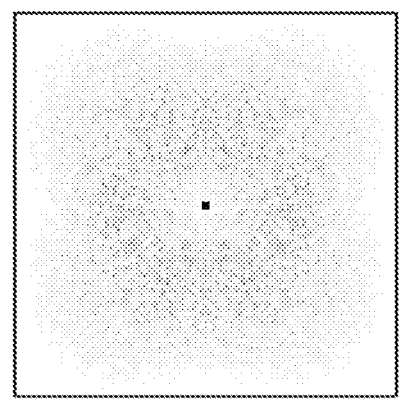
FIG. 20B shows the amplitude of the spatial frequency component of the Fourier transformed pattern of the light-diffusing layer illustrated in FIG. 20A.

FIG. 20A is a planar view of an optical sheet 15E according to Embodiment 4. FIG. 20B shows the amplitude of the spatial frequency component of the Fourier transformed pattern of a light-diffusing layer 151E illustrated in FIG. 20A.

Figure 21:
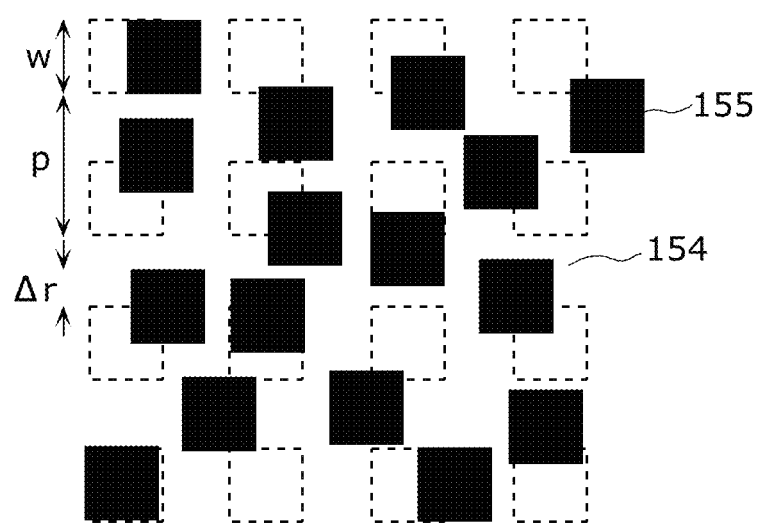
FIG. 21 illustrates the pattern of the light-diffusing layer illustrated in FIG. 20A.

FIG. 21 illustrates the pattern of the light-diffusing layer 151E illustrated in FIG. 20A. As is illustrated in FIG. 21, with the pattern according to Embodiment 4, the pattern in which the second microscopic regions 155 are arranged is a pattern resulting from applying a positional fluctuation Δr that is greater than one-fourth of the period p of the diffraction grating (or greater than one-half of the unit size w of the second microscopic region 155), with respect to the pattern of the diffraction grating illustrated in dashed lines in FIG. 21. More specifically, for example, the positional fluctuation Δr is applied with equal probability four ways: (1) positional fluctuation Δr=0, (2) positional fluctuation Δr in the x direction=p/2, (3) positional fluctuation Δr in the y direction=p/2, (4) positional fluctuation Δr in the x and y directions=p/2.

With the pattern of the light-diffusing layer 151E according to Embodiment 4, a periodic component does not appear at all. As such, with Embodiment 4, it is possible to achieve the same advantageous effects as the above described Embodiment 1. Consequently, the pattern of the light-diffusing layer 151E according to Embodiment 4 is included in the scope of the present invention.

[Diffraction Grating Comparison]

Figure 22A:
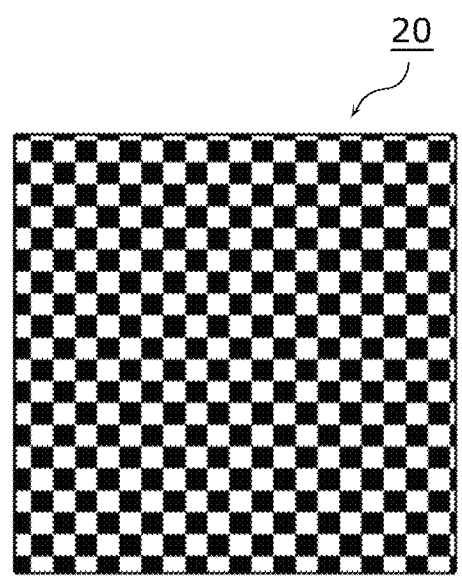
FIG. 22A is a planar view of an optical sheet having a conventional diffraction grating pattern.
Figure 22B:
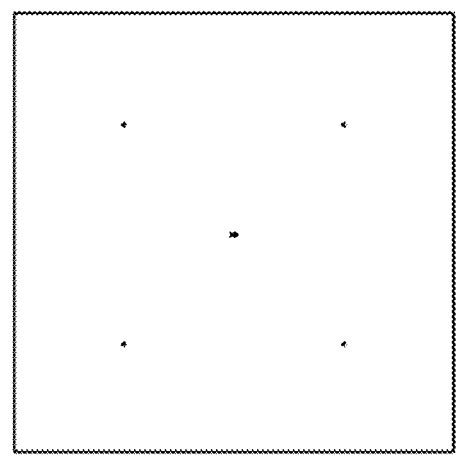
FIG. 22B shows the amplitude of the spatial frequency component of the Fourier transformed diffraction grating pattern illustrated in FIG. 22A.

FIG. 22A is a planar view of an optical sheet 20 having a conventional diffraction grating pattern. FIG. 22B shows the amplitude of the spatial frequency component of the Fourier transformed diffraction grating pattern illustrated in FIG. 22A.

As is illustrated in FIG. 22B, the diffraction grating has a property that causes light to collect in a specific direction due to interference effect on incident light. This property of the diffraction grating is different from the property of the pattern of the light-diffusing layer 151E according to Embodiment 4—that is to say, different from the property that causes diffusion of incident light by diffraction.

It should be noted that since the diffraction grating is highly dependent on wavelength, when the diffraction grating is applied to the light-emitting device, the color and brightness can become inconsistent depending on the angle at which the light-emitting device is viewed (viewing angle). For this reason, a light-emitting device that uses diffraction grating is difficult to apply to displays and difficult use as a light source in lighting applications.

[Conventional Optical Sheet Comparison]

Figure 23A:
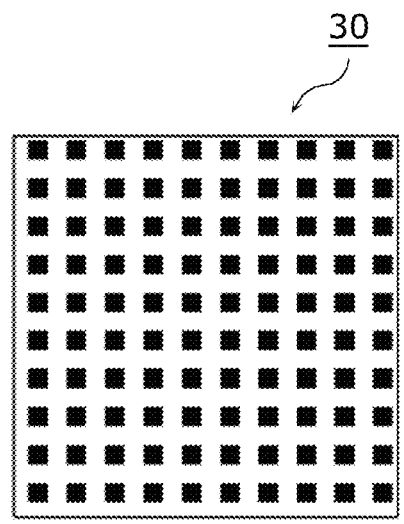
FIG. 23A is a planar view of an optical sheet having a conventional diffraction grating pattern.
Figure 23B:
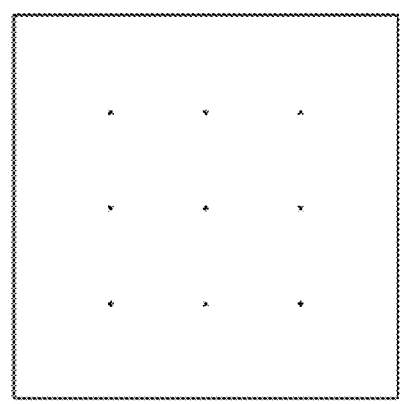
FIG. 23B shows the amplitude of the spatial frequency component of the Fourier transformed diffraction grating pattern illustrated in FIG. 23A.
Figure 24A:
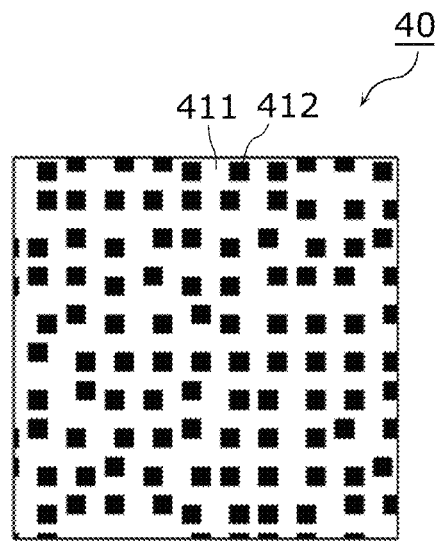
FIG. 24A is a planar view of an optical sheet in which randomness is applied to a conventional diffraction grating.
Figure 24B:
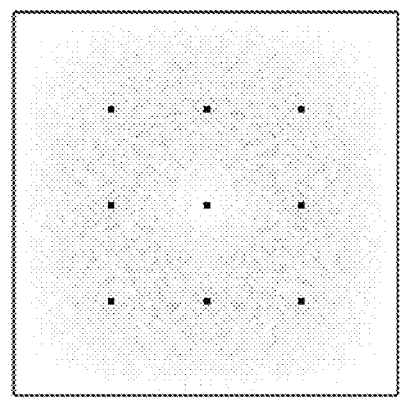
FIG. 24B shows the amplitude of the spatial frequency component of the Fourier transformed pattern illustrated in FIG. 24A.

FIG. 23A is a planar view of an optical sheet 30 having a conventional diffraction grating pattern. FIG. 23B shows the amplitude of the spatial frequency component of the Fourier transformed diffraction grating pattern illustrated in FIG. 23A. FIG. 24A is a planar view of an optical sheet 40 in which randomness is applied to a conventional diffraction grating. FIG. 24B shows the spatial frequency component of the Fourier transformed pattern illustrated in FIG. 24A.

Figure 25:
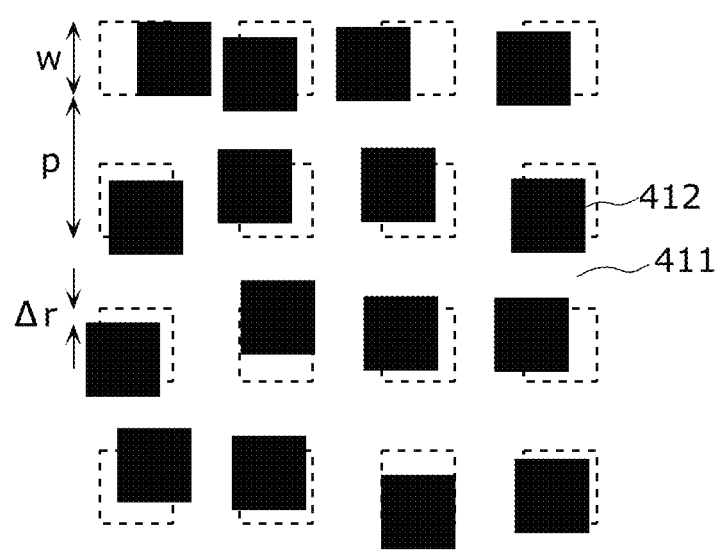
FIG. 25 illustrates the pattern of the optical sheet illustrated in FIG. 24A.

The optical sheet 40 illustrated in FIG. 24A is formed by arranging a plurality of first microscopic regions 411 and a plurality of second microscopic regions 412 according to the rules described below. FIG. 25 illustrates the pattern of the optical sheet 40 illustrated in FIG. 24A. As is illustrated in FIG. 25, with the pattern of the optical sheet 40, the pattern in which the second microscopic regions 412 are arranged is a pattern resulting from applying a positional fluctuation Δr that is less than or equal to one-fourth of the period p of the diffraction grating (or less than or equal to one-half of the unit size w), with respect to the pattern of the diffraction grating illustrated in dashed lines in FIG. 25. More specifically, for example, the positional fluctuation positional fluctuation Δr is applied with equal probability four times: (1) positional fluctuation Δr=0, (2) positional fluctuation Δr in the x direction=p/4, (3) positional fluctuation Δr in the y direction=p/4, (4) positional fluctuation Δr in the x and y directions=p/4 (see, for example, PTL 4).

However, with the pattern illustrated in FIG. 24A, a periodic component appears. Since the amplitude of the frequency component arising from the periodic nature is greater than the amplitude of the frequency component arising from the randomness in the pattern illustrated in FIG. 24A, it is possible to consider this pattern as a diffraction grating, the properties of which are different from the properties of the pattern according to Embodiment 4.

Embodiment 5

Figure 26A:
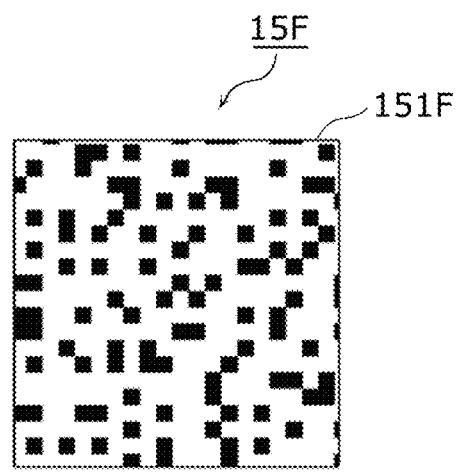
FIG. 26A is a planar view of the optical sheet according to Embodiment 5.
Figure 26B:
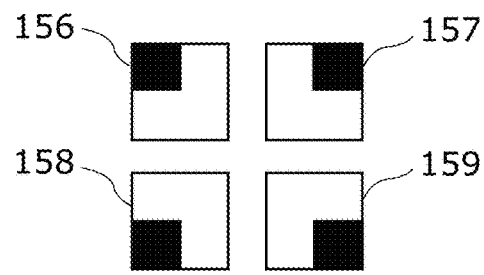
FIG. 26B is a planar view of the four types of unit structures of the light-diffusing layer illustrated in FIG. 26A.
Figure 26C:
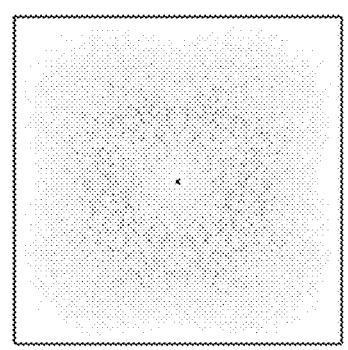
FIG. 26C shows the amplitude of the spatial frequency component of the Fourier transformed pattern of the light-diffusing layer illustrated in FIG. 26A.

FIG. 26A is a planar view of an optical sheet 15F according to Embodiment 5. FIG. 26B is a planar view of four types of unit structures—unit structures 156, 157, 158, and 159—which make up a light-diffusing layer 151F illustrated in FIG. 26A. FIG. 26C shows the amplitude of the spatial frequency component of the Fourier transformed pattern of the light-diffusing layer 151F illustrated in FIG. 26A.

The light-diffusing layer 151F according to Embodiment 4 has a pattern in which a plurality of the first unit structures 156, second unit structures 157, third unit structures 158, and fourth unit structures 159 are arranged. As is illustrated in FIG. 26C, with the pattern according to Embodiment 5, spatial frequencies in the vicinity of 0 are not present—that is to say, diffuse light does not exist in the vicinity of the emission direction of non-diffused light, which is zeroth order light, that is emitted by the light-diffusing layer 151. As such, with Embodiment 5 as well, it is possible to achieve the same advantageous effects as the above described Embodiment 1.

Embodiment 6

Figure 27A:
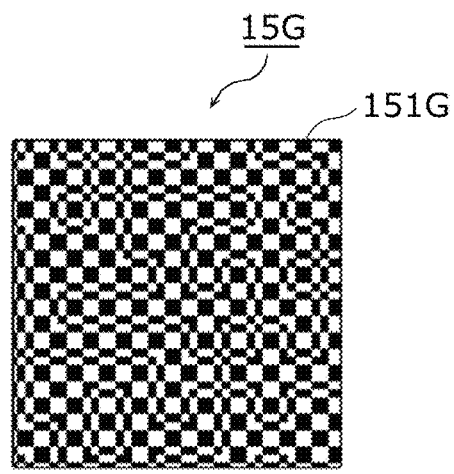
FIG. 27A is a planar view of the optical sheet according to Embodiment 6.
Figure 27B:
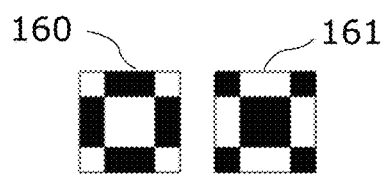
FIG. 27B is a planar view of the two types of unit structures of the light-diffusing layer shown in FIG. 27A.
Figure 27C:
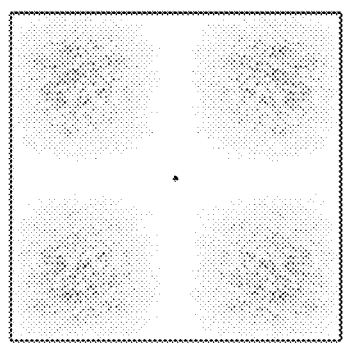
FIG. 27C shows the amplitude of the spatial frequency component of the Fourier transformed pattern of the light-diffusing layer illustrated in FIG. 27A.

FIG. 27A is a planar view of an optical sheet 15G according to Embodiment 6. FIG. 27B is a planar view of two types of unit structures—unit structures 160 and 161—which make up a light-diffusing layer 151G illustrated in FIG. 27A. FIG. 27C shows the amplitude of the spatial frequency component of the Fourier transformed pattern of the light-diffusing layer 151G illustrated in FIG. 27A.

The light-diffusing layer 151G according to Embodiment 6 has a pattern in which a plurality of the first unit structures 160 and second unit structures 161 are arranged. As is illustrated in FIG. 27C, with the pattern according to Embodiment 6, spatial frequencies in the vicinity of 0 are not present—that is to say, diffuse light does not exist in the vicinity of the emission direction of non-diffused light, which is zeroth order light, that is emitted by the light-diffusing layer 151G. As such, with Embodiment 6 as well, it is possible to achieve the same advantageous effects as the above described Embodiment 1.

Figure 27D:
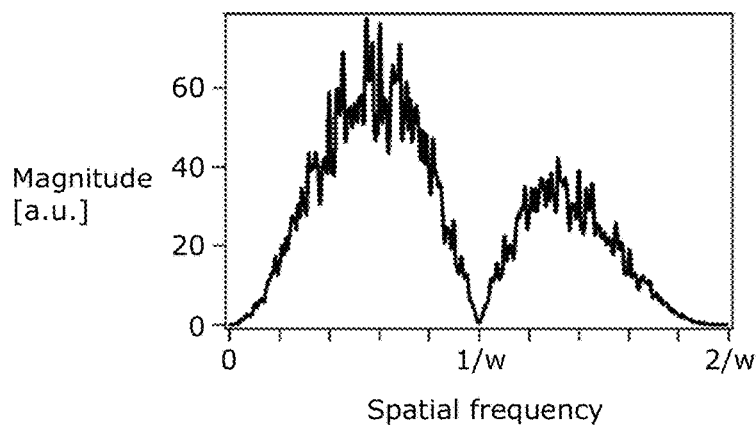
FIG. 27D shows a one-dimensional distribution in one azimuth among the spatial frequencies obtained through Fourier transform of the pattern illustrated in FIG. 27A.

FIG. 27D shows a one-dimensional distribution in one azimuth among the spatial frequencies obtained through Fourier transform of the pattern illustrated in FIG. 27A. As is illustrated in FIG. 27D, the spatial frequency component of the pattern according to Embodiment peaks at a spatial frequency slightly higher than 1/(2w). Furthermore, among spatial frequency components of this pattern, high spatial frequencies in the vicinity of 1/w and low spatial frequencies in the vicinity of 0 are kept to a minimum. In other words, the spatial frequency component of this pattern has a peak-and-valley magnitude distribution wherein spatial frequencies in the vicinities of 1/w and 0 are kept to a minimum and spatial frequencies slightly higher than 1/(2w) are at the peak. This magnitude distribution curve has a half bandwidth of around 1/(2w), for example.

Figure 27E:
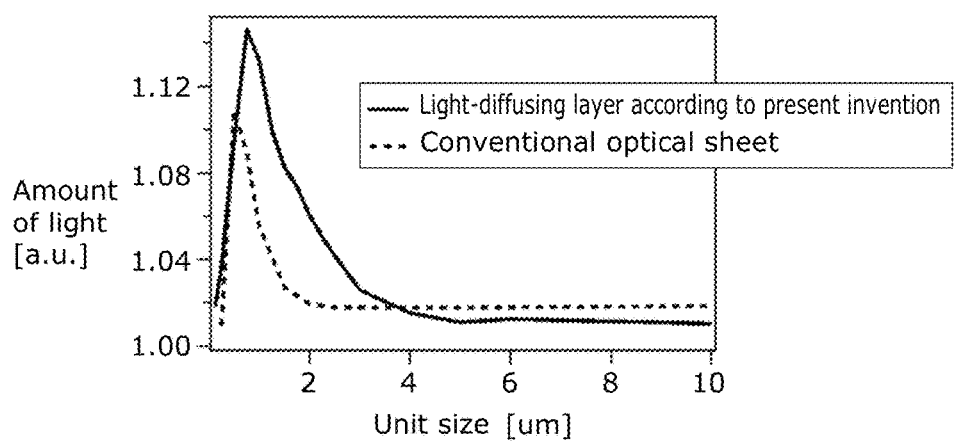
FIG. 27E shows the result of a calculation of the dependency of the total amount of light transmitted to the atmospheric layer from the light-diffusing layer on the unit size w of each of the first microscopic regions and the second microscopic regions when the light-diffusing layer is provided on the surface of the light-transmissive substrate.

FIG. 27E shows the result of a calculation of the dependency of the total amount of light transmitted to the atmospheric layer 16 from the light-diffusing layer 151G on the unit size w of each of the first microscopic regions and the second microscopic regions when the light-diffusing layer 151G is disposed on the surface of the light-transmissive substrate 14. With the configuration illustrated in FIG. 1, conditions for the calculation were set as follows. The refractive index of the first microscopic region and the refractive index of the light-transmissive substrate 14 were each set to 1.5, and the refractive index of the second microscopic region and the refractive index of the atmospheric layer 16 were each set to 1.0. In FIG. 27E, the graph represented by the solid line shows the calculation result with the light-diffusing layer 151G according to Embodiment 6. It should be noted that the graph represented by the dashed line shows the calculation result with the conventional optical sheet 60. As can be understood from FIG. 27E, in the range of unit size w from 100 nm to 4 μm, the light-diffusing layer 151G according to Embodiment 6 achieved a greater light extraction efficiency than the conventional optical sheet 60.

Figure 27F:
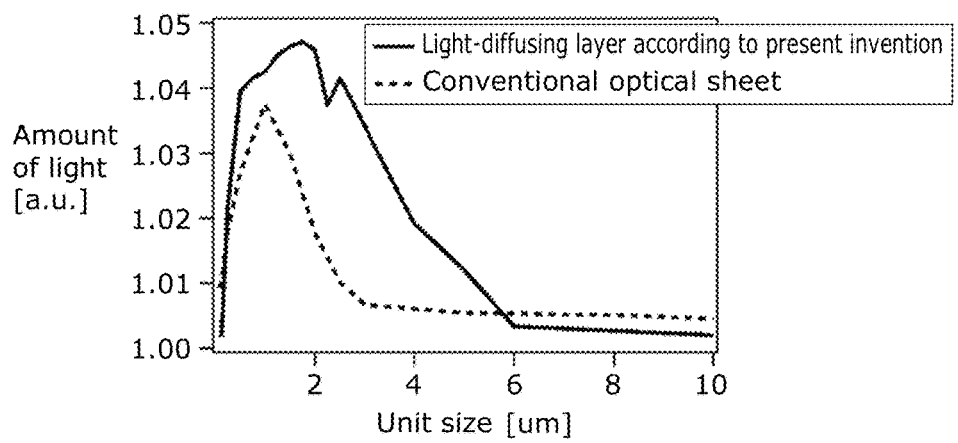
FIG. 27F shows the result of a calculation of the dependency of the total amount of light transmitted to the protective layer from the optical sheet on the unit size w of each of the first microscopic regions and the second microscopic regions when the optical sheet is provided between the high refractive index layer and the protective layer.

FIG. 27F shows the result of a calculation of the dependency of the total amount of light transmitted to the protective layer 16C from the light-diffusing layer 151G on the unit size w of each of the first microscopic regions and the second microscopic regions when the light-diffusing layer 151G is disposed between the high refractive index layer 14C and the protective layer 16C. With the same configuration illustrated in FIG. 15A, conditions for the calculation were set as follows. The refractive index of the first microscopic region and refractive index of the high refractive index layer 14C were each set to 1.75, and the refractive index of the second microscopic region and the refractive index of the protective layer 16C were each set to 1.5. In FIG. 27F, the graph represented by the solid line shows the calculation result with the light-diffusing layer 151G according to Embodiment 6. It should be noted that the graph represented by the dashed line shows the calculation result with the conventional optical sheet 60. As can be understood from FIG. 27F, in the range of unit size w from 125 nm to 6 μm, the light-diffusing layer 151G according to Embodiment 6 achieved a greater light extraction efficiency than the conventional optical sheet 60.

Embodiment 7

Figure 28A:
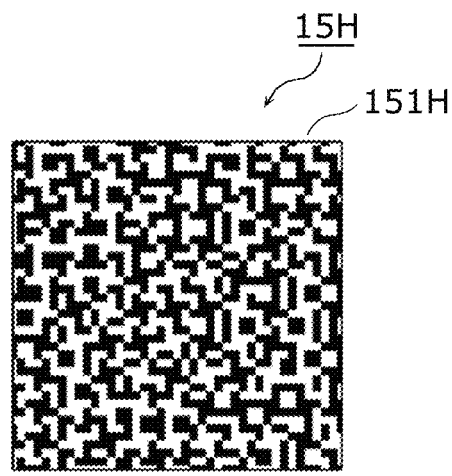
FIG. 28A is a planar view of the optical sheet according to Embodiment 7.
Figure 28B:
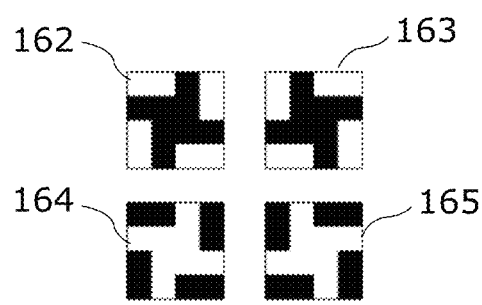
FIG. 28B is a planar view of the four types of unit structures of the light-diffusing layer shown in FIG. 28A.
Figure 28C:
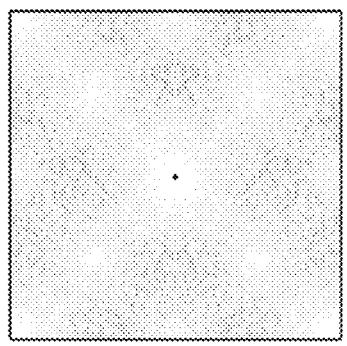
FIG. 28C shows the amplitude of the spatial frequency component of the Fourier transformed pattern of the light-diffusing layer illustrated in FIG. 28A.

FIG. 28A is a planar view of an optical sheet 15H according to Embodiment 7. FIG. 28B is a planar view of four types of unit structures—unit structures 162, 163, 164, and 165—which make up a light-diffusing layer 151H illustrated in FIG. 28A. FIG. 28C shows the amplitude of the spatial frequency component of the Fourier transformed pattern of the light-diffusing layer 151H illustrated in FIG. 28A.

The light-diffusing layer 151H according to Embodiment 7 has a pattern in which a plurality of the first unit structures 162, second unit structures 163, third unit structures 164, and fourth unit structures 165 are arranged. As is illustrated in FIG. 28C, with the pattern according to Embodiment 7, spatial frequencies in the vicinity of 0 are not present—that is to say, diffuse light does not exist in the vicinity of the emission direction of non-diffused light, which is zeroth order light, that is emitted by the light-diffusing layer 151H. As such, with Embodiment 7 as well, it is possible to achieve the same advantageous effects as the above described Embodiment 1.

Embodiment 8

Figure 29A:
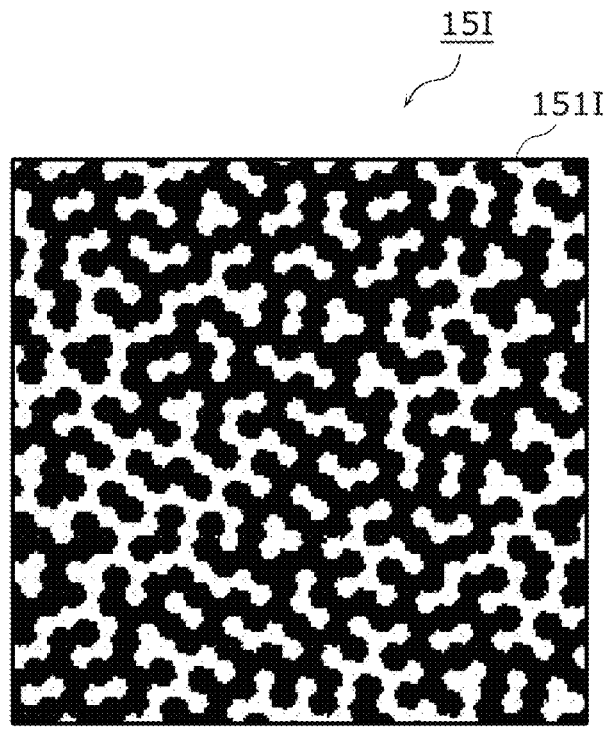
FIG. 29A is a planar view of the optical sheet according to Embodiment 8.
Figure 29B:
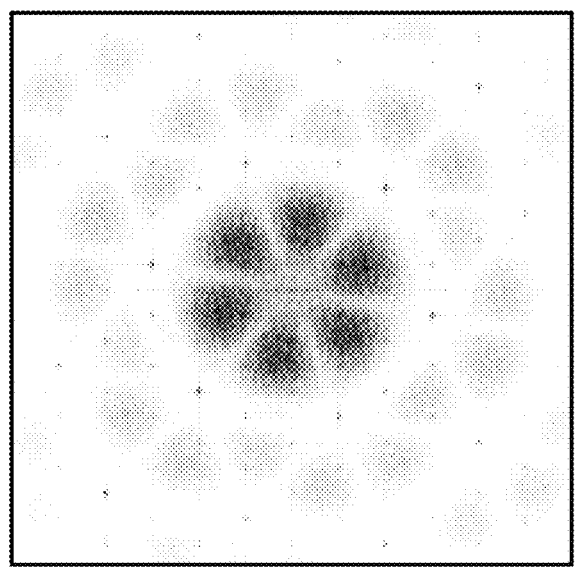
FIG. 29B shows the amplitude of the spatial frequency component of the Fourier transformed pattern of the light-diffusing layer illustrated in FIG. 29A.

FIG. 29A is a planar view of an optical sheet 15I according to Embodiment 8. FIG. 29B shows the amplitude of the spatial frequency component of the Fourier transformed pattern of a light-diffusing layer 151I illustrated in FIG. 29A.

In Embodiment 8, the light-diffusing layer 151I has a pattern in which a plurality of unit structures which have a regular hexagonal shape in a planar view are arranged. As is illustrated in FIG. 29B, with the pattern according to Embodiment 8, spatial frequencies in the vicinity of 0 are not present—that is to say, diffuse light does not exist in the vicinity of the emission direction of non-diffused light, which is zeroth order light, that is emitted by the light-diffusing layer 151I. As such, with Embodiment 5 as well, it is possible to achieve the same advantageous effects as the above described Embodiment 1.

Figure 30A:
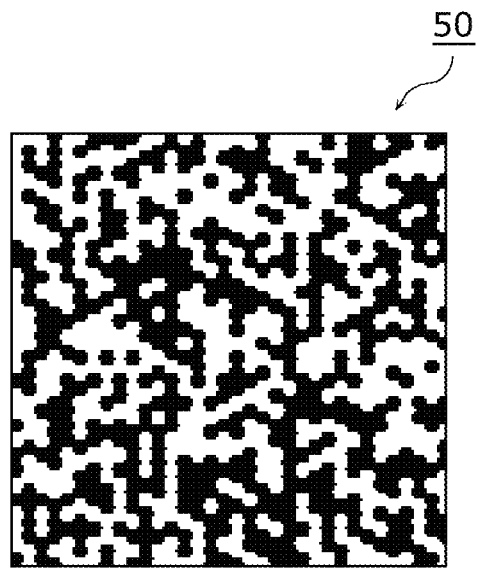
FIG. 30A is a planar view of an optical sheet in which regular hexagonal unit structures are arranged in a conventional random pattern.
Figure 30B:
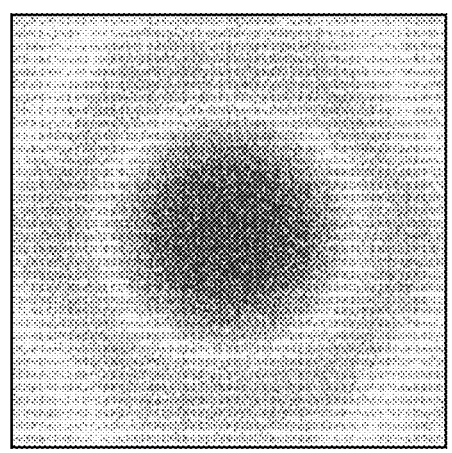
FIG. 30B shows the amplitude of the spatial frequency component of the Fourier transformed random pattern of the optical sheet illustrated in FIG. 30A.

Next, in order to provide a comparison for the pattern according to Embodiment 8, a case in which a plurality of unit structures which have a regular hexagonal shape in a planar view are arranged in a conventional random pattern will be described. FIG. 30A is a planar view of an optical sheet 50 in which regular hexagonal unit structures are arranged in a conventional random pattern. FIG. 30B shows the amplitude of the spatial frequency component of the Fourier transformed pattern of the optical sheet 50 illustrated in FIG. 30A. It can be understood from the random pattern illustrated in FIG. 30B that spatial frequencies in the vicinity of 0 are present—that is to say, that diffuse light is present in the vicinity of the emission direction of non-diffused light, which is zeroth order light, that is emitted by the optical sheet 50.

Variation of Embodiment 8

Figure 31A:
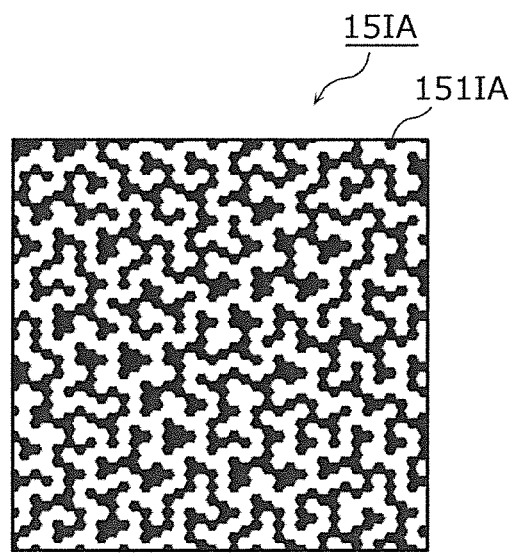
FIG. 31A is a planar view of the optical sheet according to a variation of Embodiment 8.
Figure 31B:
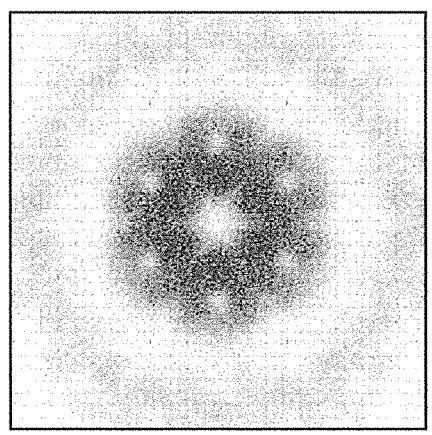
FIG. 31B shows the amplitude of the spatial frequency component of the Fourier transformed pattern of the light-diffusing layer illustrated in FIG. 31A.

FIG. 31A is a planar view of an optical sheet 15IA according to a Variation of Embodiment 8. FIG. 31B shows the amplitude of the spatial frequency component of the Fourier transformed pattern of a light-diffusing layer 151IA illustrated in FIG. 31A.

In this Variation, the light-diffusing layer 151IA has a pattern in which a plurality of unit structures which have a regular hexagonal shape in a planar view are arranged, as is illustrated in FIG. 31A. It should be noted that the pattern according to this Variation is a pattern that is different from Embodiment 8 described above.

As is illustrated in FIG. 31B, with the pattern according to this Variation, spatial frequencies in the vicinity of 0 are not present—that is to say, diffuse light does not exist in the vicinity of the emission direction of non-diffused light, which is zeroth order light, that is emitted by the light-diffusing layer 151IA. As such, with this Variation of Embodiment 8 as well, it is possible to achieve the same advantageous effects as the above described Embodiment 1.

Embodiment 9

Figure 32A:
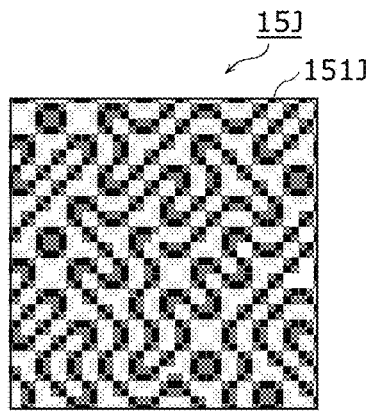
FIG. 32A is a planar view of the optical sheet according to Embodiment 9.
Figure 32B:
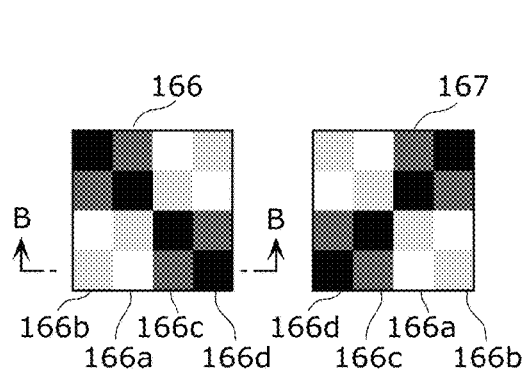
FIG. 32B is a planar view of the two types of unit structures of the light-diffusing layer shown in FIG. 32A.
Figure 32C:
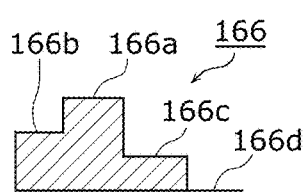
FIG. 32C is a cross sectional view of the first unit structure cut at the line B-B in FIG. 32B.
Figure 32D:
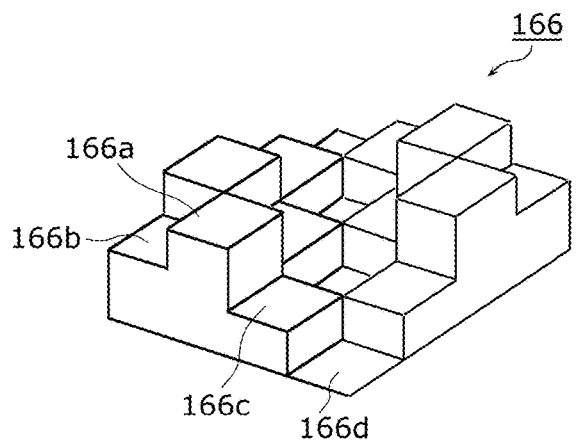
FIG. 32D is a perspective view of the first unit structure.
Figure 32E:
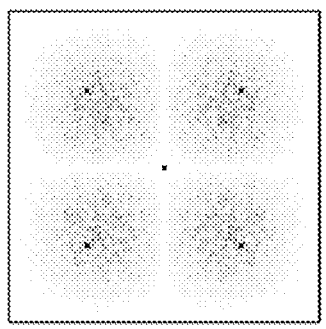
FIG. 32E shows the amplitude of the spatial frequency component of the Fourier transformed pattern of the light-diffusing layer illustrated in FIG. 32A.

FIG. 32A is a planar view of an optical sheet 15J according to Embodiment 9. FIG. 32B is a planar view of two types of unit structures—unit structures 166 and 167—which make up a light-diffusing layer 151J illustrated in FIG. 32A. FIG. 32C is a cross sectional view of the first unit structure 166 cut at the line B-B in FIG. 32B. FIG. 32D is a perspective view of the first unit structure 166. FIG. 32E shows the amplitude of the spatial frequency component of the Fourier transformed pattern of the light-diffusing layer 151J illustrated in FIG. 32A.

In Embodiment 9, the light-diffusing layer 151J has a pattern in which a plurality of the first unit structures 166 and second unit structures 167 are arranged.

The first unit structure 166 is formed by arranging in a first pattern four first microscopic regions 166a, four second microscopic regions 166b, four third microscopic regions 166c, and four fourth microscopic regions 166d. In a planar view, the first unit structure 166 has a quadrilateral (square) shape.

The second unit structure 167 is formed by arranging in a second pattern, which is different from the first pattern, four first microscopic regions 166a, four second microscopic regions 166b, four third microscopic regions 166c, and four fourth microscopic regions 166d. In a planar view, the second unit structure 167 has a quadrilateral (square) shape.

As is illustrated in FIG. 32C and FIG. 32D, the first microscopic region 166a has the tallest height, the second microscopic region 166b has the second tallest height, the third microscopic region 166c has the third tallest height, and the fourth microscopic region 166d has the shortest height.

As is illustrated in FIG. 32E, with the pattern according to Embodiment 9, spatial frequencies in the vicinity of 0 are not present—that is to say, diffuse light does not exist in the vicinity of the emission direction of non-diffused light, which is zeroth order light, that is emitted by the light-diffusing layer 151J. As such, with Embodiment 9 as well, it is possible to achieve the same advantageous effects as the above described Embodiment 1.

Embodiment 10

Figure 33A:
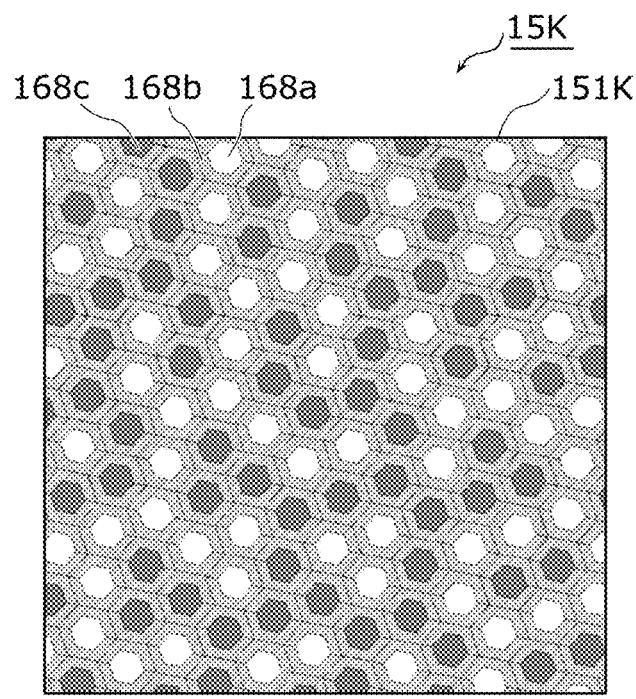
FIG. 33A is a planar view of the optical sheet according to Embodiment 10.
Figure 33B:
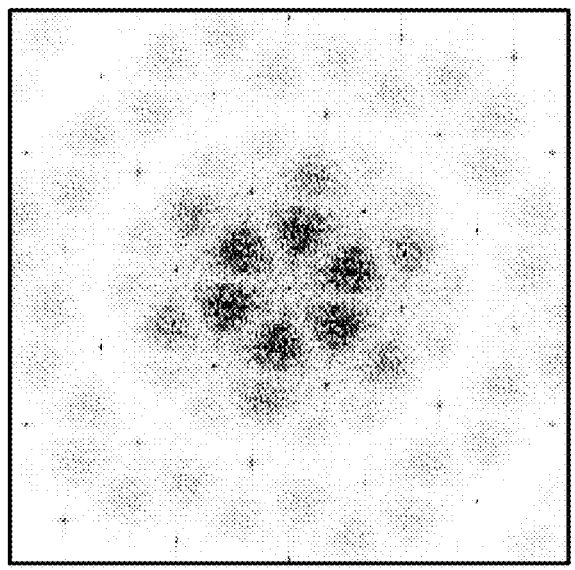
FIG. 33B shows the amplitude of the spatial frequency component of the Fourier transformed pattern of the light-diffusing layer illustrated in FIG. 33A.

FIG. 33A is a planar view of an optical sheet 15K according to Embodiment 10. FIG. 33B shows the amplitude of the spatial frequency component of the Fourier transformed pattern of a light-diffusing layer 151K illustrated in FIG. 33A.

As is illustrated in FIG. 33A, the light-diffusing layer 151K of the optical sheet 15K according to Embodiment 10 has a pattern in which a plurality of first microscopic regions 168a (white regions in FIG. 33A), a plurality of second microscopic regions 168b (grey regions in FIG. 33A), and a plurality of third microscopic regions 168c (black regions in FIG. 33A) are arranged. Each first microscopic region 168a and third microscopic region 168c has a regular hexagonal shape in a planar view. For example, the first microscopic region 168a has the tallest height, the second microscopic region 168b has the second tallest height, and the third microscopic region 168c has the shortest height.

As is illustrated in FIG. 33B, with the pattern according to Embodiment 10, spatial frequencies in the vicinity of 0 are not present—that is to say, diffuse light does not exist in the vicinity of the emission direction of non-diffused light, which is zeroth order light, that is emitted by the light-diffusing layer 151K. As such, with Embodiment 10 as well, it is possible to achieve the same advantageous effects as the above described Embodiment 1.

Embodiment 11

Figure 34A:
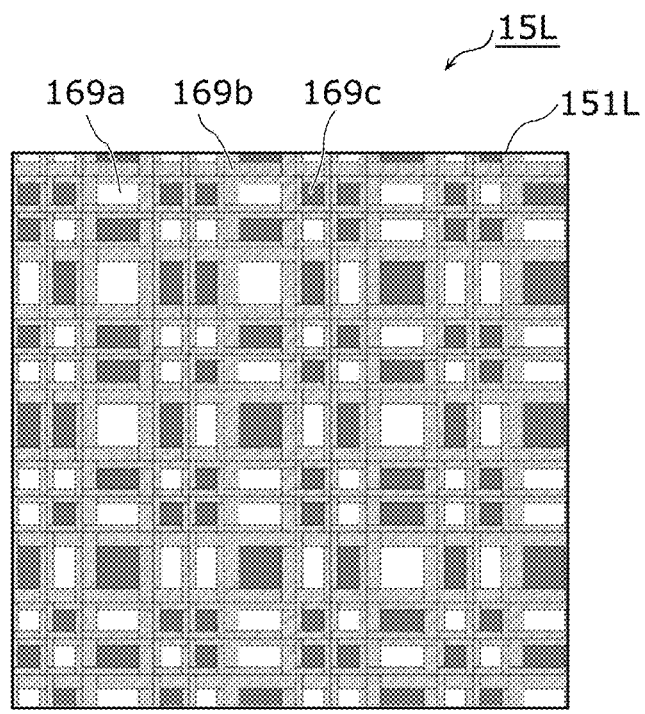
FIG. 34A is a planar view of the optical sheet according to Embodiment 11.
Figure 34B:
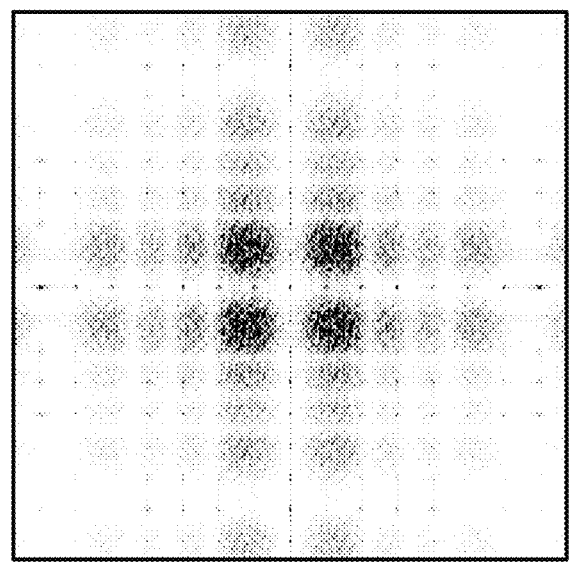
FIG. 34B shows the amplitude of the spatial frequency component of the Fourier transformed pattern of the light-diffusing layer illustrated in FIG. 34A.

FIG. 34A is a planar view of an optical sheet 15L according to Embodiment 11. FIG. 34B shows the amplitude of the spatial frequency component of the Fourier transformed pattern of a light-diffusing layer 151L illustrated in FIG. 34A.

As is illustrated in FIG. 34A, the light-diffusing layer 151L of the optical sheet 15L according to Embodiment 11 has a pattern in which a plurality of first microscopic regions 169a (white regions in FIG. 34A), a plurality of second microscopic regions 169b (grey regions in FIG. 34A), and a plurality of third microscopic regions 169c (black regions in FIG. 34A) are arranged. Each first microscopic region 169a and third microscopic region 169c has a quadrilateral shape in a planar view. For example, the first microscopic region 169a has the tallest height, the second microscopic region 169b has the second tallest height, and the third microscopic region 169c has the shortest height.

As is illustrated in FIG. 34B, with the pattern according to Embodiment 11, spatial frequencies in the vicinity of 0 are not present—that is to say, diffuse light does not exist in the vicinity of the emission direction of non-diffused light, which is zeroth order light, that is emitted by the light-diffusing layer 151L. As such, with Embodiment 11 as well, it is possible to achieve the same advantageous effects as the above described Embodiment 1.

Embodiment 12

Figure 35A:
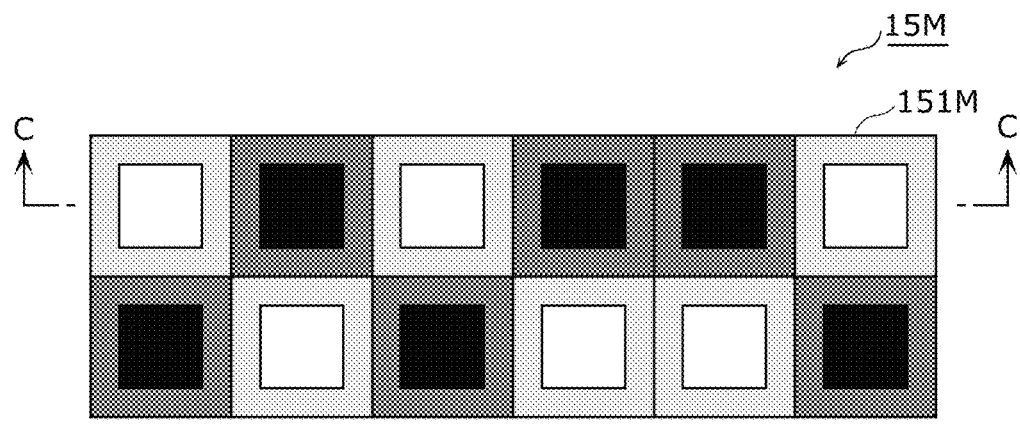
FIG. 35A is an enlarged planar view of a portion of the optical sheet according to Embodiment 12.
Figure 35B:
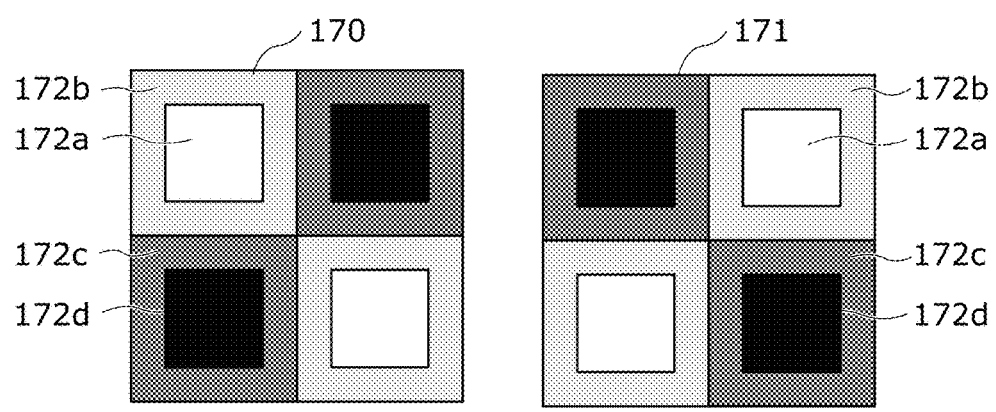
FIG. 35B is a planar view of the two types of unit structures of the light-diffusing layer shown in FIG. 35A.
Figure 35C:
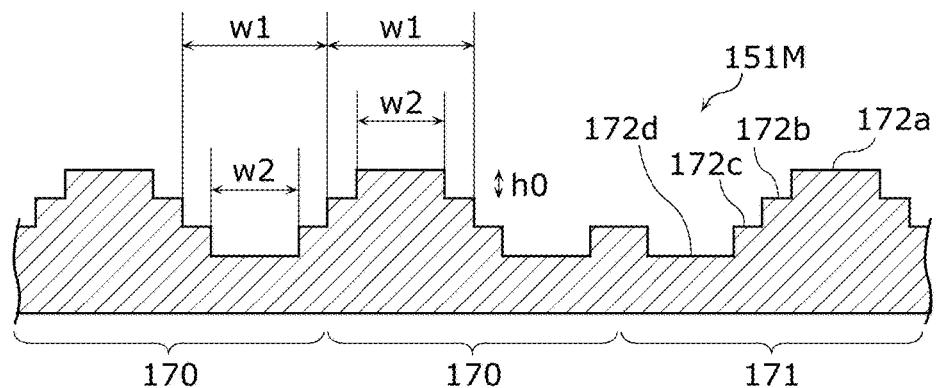
FIG. 35C is a cross sectional view of the light-diffusing layer cut at the line C-C in FIG. 35A.

FIG. 35A is an enlarged planar view of a portion of an optical sheet 15M according to Embodiment 12. FIG. 35B is a planar view of two types of unit structures—unit structures 170 and 171—which make up a light-diffusing layer 151M illustrated in FIG. 35A. FIG. 35C is a cross sectional view of the light-diffusing layer 151M cut at the line C-C in FIG. 35A.

As is illustrated in FIG. 35A, the light-diffusing layer 151M of the optical sheet 15M according to Embodiment 12 has a pattern in which a plurality of the first unit structures 170 and second unit structures 171 are arranged.

As is illustrated in FIG. 35B, the first unit structure 170 is formed by arranging in a first pattern microscopic regions of different types and heights—that is to say, arranging in a first pattern two first microscopic regions 172*a* (white regions in FIG. 35B), two second microscopic regions 172*b* (light grey regions in FIG. 35B), two third microscopic regions 172*c* (dark grey regions in FIG. 35B), and two fourth microscopic regions 172*d* (black regions in FIG. 35B). Each first through fourth microscopic region 172*a* through 172*d* has a quadrilateral (square) shape in a planar view. In a planar view, the first unit structure 170 has an overall quadrilateral (square), mufti-level shape.

The second unit structure 171 is formed by arranging in a second pattern, which is different from the first pattern, two first microscopic regions 172*a*, two second microscopic regions 172*b*, two third microscopic regions 172*c*, and two fourth microscopic regions 172*d*. In a planar view, the second unit structure 171 has an overall quadrilateral (square), mufti-level shape.

As is illustrated in FIG. 35C, the first microscopic region 172*a* has the tallest height, the second microscopic region 172*b* has the second tallest height, the third microscopic region 172*c* has the third tallest height, and the fourth microscopic region 172*d* has the shortest height. It should be noted that when the height of the third microscopic region 172*c* is h0 relative to the height of the fourth microscopic region 172*d*, the height of the second microscopic region 172*b* is 2h0, and the height of the first microscopic region 172*a* is 3h0.

Furthermore, as is illustrated in FIG. 35C, the unit size w2 of the first microscopic region 172*a* is smaller than the unit size w1 of the second microscopic region 172*b*. Moreover, the unit size w2 of the fourth microscopic region 172*d* is smaller than the unit size w1 of the third microscopic region 172*c*.

Figure 35D:
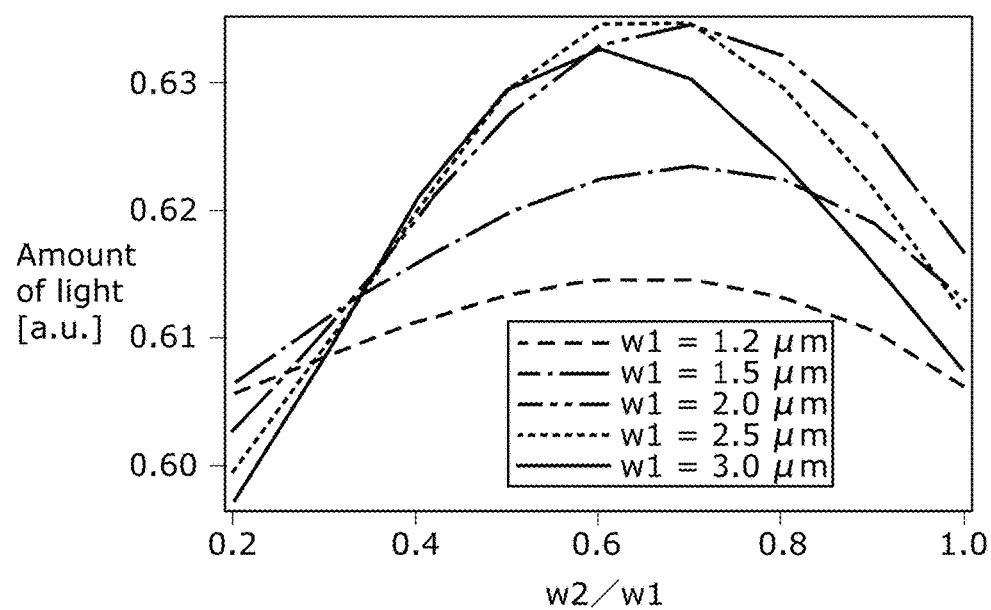
FIG. 35D shows the result of a calculation of the dependency of the total amount of light transmitted to the atmospheric layer from the light-diffusing layer according to Embodiment 12 on the ratio of the unit size w2 and the unit size w1.

FIG. 35D shows the result of a calculation of the dependency of the total amount of light transmitted to the atmospheric layer from the light-diffusing layer 151M according to Embodiment 12 on the ratio of the unit size w2 and the unit size w1. In FIG. 35D, the ratio w2/w1 of the unit size w2 and the unit size w1 is represented on the horizontal axis, and the total amount of light transmitted to the atmospheric layer from the light-diffusing layer 151M is represented on the vertical axis. Conditions for the calculation were set as follows. The first level height h0 of the mufti-level first unit structure 170 (or the second unit structure 171) was set to 300 nm. In FIG. 35D, the five graphs show the calculation results when the unit size w1 of the second microscopic region 172*b* (or the third microscopic region 172*c*) is 1.2 µm, 1.5 µm, 2.0 µm, 2.5 µm and 3.0 µm.

As can be understood from FIG. 35D, in the range of the ratio w2/w1 of the unit size w2 and the unit size w1 from 0.4 to 1.0, the light-diffusing layer 151M according to Embodiment 12 achieved a great light extraction efficiency.

Embodiment 13

Figure 36A:
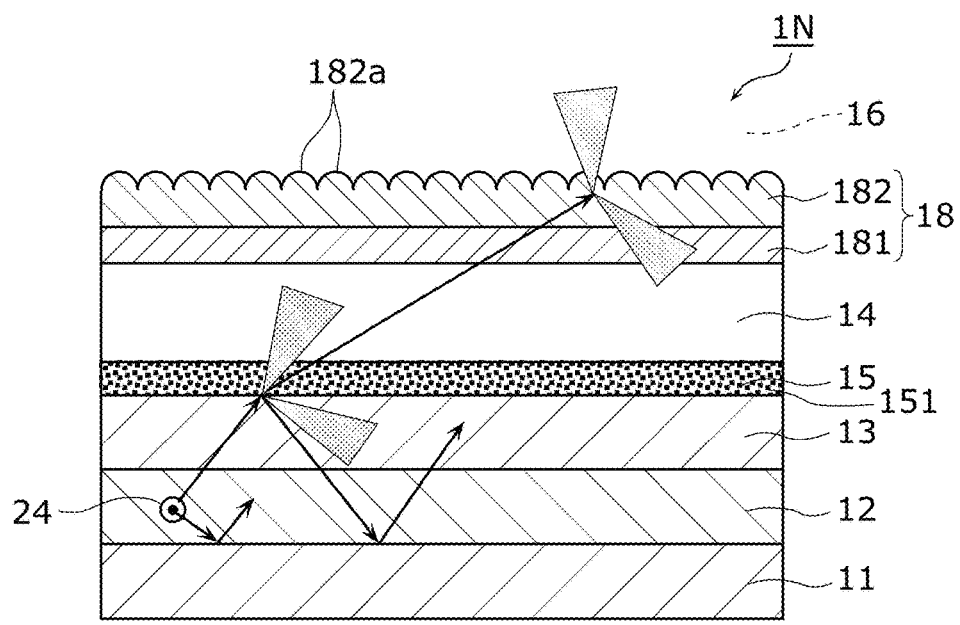
FIG. 36A is a cross sectional view of the light-emitting device according to Embodiment 13.

FIG. 36A is a cross sectional view of a light-emitting device 1N according to Embodiment 13. As is illustrated in FIG. 36A, the light-emitting device 1N according to Embodiment 13 includes the electrode 11, the light-emitting layer 12 (including the light-emitting unit 24), the light-transmissive electrode 13, the light-diffusing layer 151, the light-transmissive substrate 14, and an auxiliary optical sheet 18 stacked in this order. The configuration of each of the electrode 11, the light-emitting layer 12, the light-transmissive electrode 13, the light-transmissive substrate 14, and the light-diffusing layer 151 is the same as in Embodiment 1, and as such, descriptions thereof are omitted.

The auxiliary optical sheet 18 is disposed on the surface of the light-transmissive substrate 14. The auxiliary optical sheet 18 has a structure which extracts light, and combines a light-diffusing layer 181 and a micro lens 182. The light-diffusing layer 181 is disposed on the surface of the light-transmissive substrate 14, and, for example, has the same light diffusing function as the light-diffusing layer 151 of the optical sheet 15. The micro lens 182 is disposed on the surface of the light-diffusing layer 181. A plurality of convex lenses 182*a* are arranged two-dimensionally on the surface of the micro lens 182.

A portion of the light generated by the light-emitting unit 24 is incident on the light-diffusing layer 151 after passing through the light-transmissive electrode 13. Moreover, a portion of the light generated by the light-emitting unit 24 is incident on the light-diffusing layer 151 after being reflected off the electrode 11 and passing through the light-transmissive electrode 13. At least a portion of the light incident on the light-diffusing layer 151 passes through the light-transmissive substrate 14 after being diffused by diffraction. The light that passes through the light-transmissive substrate 14 is incident on the auxiliary optical sheet 18. At least a portion of the light incident on the auxiliary optical sheet 18 is extracted to the atmospheric layer 16, which is external to the light-emitting device 1N, after being diffused by diffraction.

In Embodiment 13, since the auxiliary optical sheet 18 is provided in addition to the light-diffusing layer 151, it is possible to even further improve the light extracting efficiency.

Variation of Embodiment 13

Figure 36B:
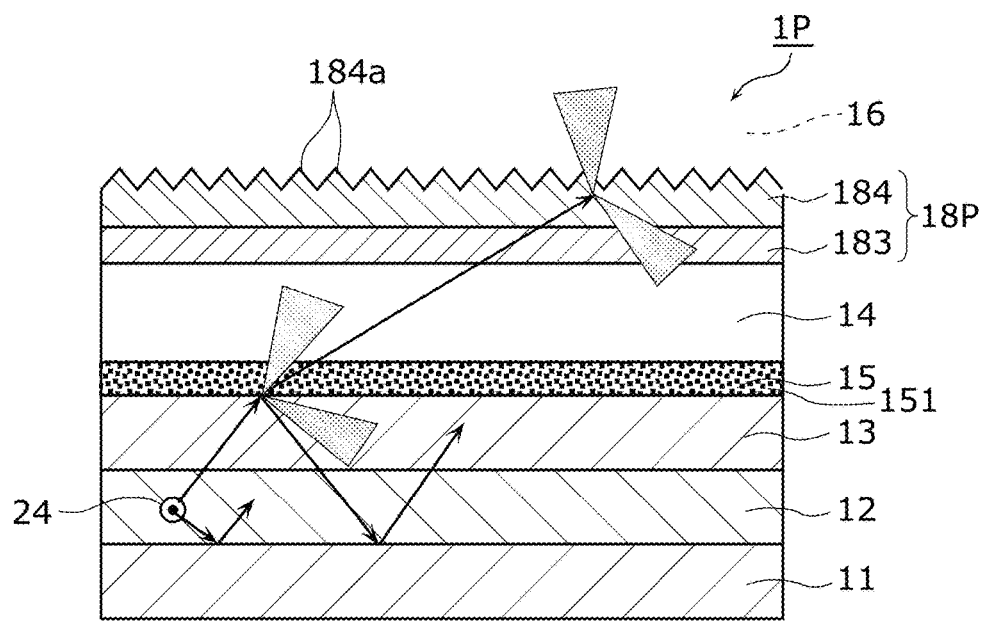
FIG. 36B is a cross sectional view of the light-emitting device according to a variation of Embodiment 13.

FIG. 36B is a cross sectional view of a light-emitting device 1P according to this Variation of Embodiment 13. As is illustrated in FIG. 36B, with the light-emitting device 1P according to this Variation of Embodiment 13, an auxiliary optical sheet 18P has a structure which extracts light, and combines a diffraction grating 183 and a pyramid structure 184. The diffraction grating 183 is disposed on the surface of the light-transmissive substrate 14, and has the function of diffracting incident light. The pyramid structure 184 is disposed on the surface of the diffraction grating 183. A plurality of pyramid-shaped (quadrilateral cone shape) pyramid components 184*a* are two-dimensionally arranged on the surface of the pyramid structure 184.

In this Variation of Embodiment 13 as well, since the auxiliary optical sheet 18P is provided in addition to the light-diffusing layer 151, it is possible to even further improve the light extracting efficiency.

It should be noted that in this Variation, the auxiliary optical sheet 181P is formed by combining the diffraction grating 183 and the pyramid structure 184, but this example is not limiting. For example, two or more of any of the following may be arbitrarily combined to form the auxiliary optical sheet: the light-diffusing layer 181, the micro lens 182, the diffraction grating 183, and the pyramid structure 184. Alternatively, the auxiliary optical sheet may include one of the following: the light-diffusing layer 181, the micro lens 182, the diffraction grating 183, and the pyramid structure 184. Moreover, as a substitute for the light-diffusing layer 181, a light-diffusing layer having fine particles that diffuse light may be used.

Hereinbefore, the optical sheet, light-emitting device, manufacturing method of the optical sheet, and manufacturing method of the light-emitting device according to one or more aspects of the present invention have been described based on the above embodiments, but the present invention is not limited the these embodiments. Various modifications of the exemplary embodiments as well as embodiments resulting from arbitrary combinations of constituent elements of different exemplary embodiments that may be conceived by those skilled in the art are intended to be included within the scope of the one or more aspects of the present invention as long as these do not depart from the essence of the present invention.

In an above embodiment, the layer to which the light from the light-emitting device is emitted is the atmospheric layer or the protective layer, but these example are not limiting, and the layer may be, for example, a liquid layer.

In an above embodiment, the first microscopic regions are configured as protrusions and the second microscopic regions are configured as recesses in order to produce a phase shift between light passing through the plurality of first microscopic regions and the light passing through the plurality of second microscopic regions, but, for example, each of the first microscopic regions and the second microscopic regions may have the same height and be made of a first media and a second media that have different refractive indices.

In an above embodiment, the optical sheet or the light-diffusing layer were exemplified as being single layers, but when there are a plurality boundaries where loss of light from total internal reflection occurs, a plurality of optical sheets or a plurality of light-diffusing layers may be provided, and among these, when the same optical sheet or light-diffusing layer as described in the above embodiments is used in one location, this example is included in the scope of the present invention. Moreover, an optical sheet or a light-diffusing layer which has multiple layers may be disposed inside the light-emitting device.

In an above embodiment, the first microscopic region and the second microscopic region are exemplified as each having a quadrilateral shape in a planar view, but the shape of each first microscopic region and second microscopic region may be changed arbitrarily. For example, each first microscopic region and second microscopic region may have a circular cone or a circular truncated cone shape. Alternatively, the corners of a cross section of each first microscopic region and second microscopic region may be curved. There are instances where, upon working of a microscopic structure by cutting or a semiconductor process, the corners are worked to be curved or alternatively worked to have a bevel. Upon working the light-diffusing layer, if the cause of these arises, an optical sheet including the first microscopic region and second microscopic region worked to have curved corners is included within the scope of the present invention, as long as the quality of above described pattern is not lost.

INDUSTRIAL APPLICABILITY

The light-emitting device according to the present invention is applicable as, for example, a flat panel display, a backlight for a liquid crystal display device, and a source of light for lighting equipment. Moreover, the optical sheet according to the present invention is applicable in the above described light-emitting device.

REFERENCE SIGNS LIST 1, 1C, 1D, 1DA, 1N, 1P light-emitting device
11 electrode
12 light-emitting layer
13 light-transmissive electrode
14, 23, 23DA, 61 light-transmissive substrate
14C high refractive index layer
15, 15A, 15B, 15C, 15E, 15F, 15G, 15H, 15I, 151A, 15J, 15K, 15L, 15M, 20, 22, 22DA, 30, 40, 50, 60 optical sheet
16 atmospheric layer
16C light-transmissive substrate
18, 18P auxiliary optical sheet
21 reflective layer
24, 24DA light-emitting unit
25 external layer
150 substrate
151, 151A, 151C, 151E, 151F, 151G, 151H, 151I, 151IA, 151J, 151K, 151L, 151M, 181, 221 light-diffusing layer
151', 151Ca', 151Cb' residual film portion
152, 156, 160, 162, 166, 170 first unit structure
153, 157, 161, 163, 167, 171 second unit structure
154, 166a, 168a, 169a, 172a, 411, 601 first microscopic region
154a, 154Ba, 222 protrusion
155, 166b, 168b, 169b, 172b, 412, 602 second microscopic region
155a, 155Ba, 223 recess
158, 164 third unit structure
159, 165 fourth unit structure
166c, 168c, 169c, 172c third microscopic region
166d, 172d fourth microscopic region
182 micro lens
182a lens
183 diffraction grating
184 pyramid structure
184a pyramid component

The invention claimed is:

1. An optical sheet comprising:
a light-diffusing layer for diffusing incident light by diffracting at least a portion of the incident light,
wherein the light-diffusing layer includes a plurality of first microscopic regions and a plurality of second microscopic regions,
the plurality of first microscopic regions and the plurality of second microscopic regions are configured to produce a phase difference between light passing through the plurality of first microscopic regions and light passing through the plurality of second microscopic regions,
the plurality of first microscopic regions and the plurality of second microscopic regions form a pattern having a spatial frequency component that peaks between spatial frequencies of $0.068/(\lambda \times n)$ and $2.8/(\lambda \times n)$, inclusive, where $\lambda$ is a central light emission wavelength of light incident on the light-diffusing layer and n is a refractive index of a layer in contact with the light-diffusing layer on a side from which light is emitted, and
a center direction of emission directions of diffuse light diffused by the light-diffusing layer is away from an emission direction of non-diffused light that is refracted according to Snell's law upon impinging on the light-diffusing layer but passes through the light-diffusing layer without being diffused by the light-diffusing layer.

2. The optical sheet according to claim 1,
wherein the plurality of first microscopic regions are made of a material having a different refractive index than a refractive index of material of which the plurality of second microscopic regions are made.

3. The optical sheet according to claim 2,
wherein the plurality of first microscopic regions are protrusions having planar surfaces,
the plurality of second microscopic regions are recesses having planar surfaces, and
the protrusions have an average height of 1.5 μm or less relative to the recesses.

4. The optical sheet according to claim 1,
wherein the diffuse light diffused by the light-diffusing layer is emitted from the light-diffusing layer in a plurality of directions, and
each beam of the diffuse light is diffused away from the emission direction of the non-diffused light that is refracted according to Snell's law upon impinging on the light-diffusing layer but passes through the light-diffusing layer without being diffused.

5. A method for manufacturing the optical sheet according to claim 1, the method comprising
forming a light-diffusing layer by disposing a plurality of first unit structures and a plurality of second unit structures wherein each of the first unit structures is formed by arranging at least two types of microscopic regions in a first pattern, and each of the second unit structures is formed by arranging the at least two types of the microscopic regions in a second pattern different from the first pattern.

6. The optical sheet according to claim 1,
wherein the spatial frequency component peaks between spatial frequencies of $0.068/(\lambda \times n)$ and $1.3/(\lambda \times n)$, inclusive.

7. An optical sheet comprising:
a light-diffusing layer for diffusing incident light by diffracting at least a portion of the incident light,
wherein the light-diffusing layer includes a plurality of first microscopic regions and a plurality of second microscopic regions,
the plurality of first microscopic regions and the plurality of second microscopic regions are configured to produce a phase difference between light passing through the plurality of first microscopic regions and light passing through the plurality of second microscopic regions,
when light incident on the light-diffusing layer at an angle greater than a critical angle accounts for 50% or more of a total light intensity of light incident on the light-diffusing layer, the plurality of first microscopic regions and the plurality of second microscopic regions form a pattern having a spatial frequency component that peaks between spatial frequencies of $0.055/(\lambda \times n)$ and $0.45/(\lambda \times n)$, inclusive, where $\lambda$ is a central light emission wavelength of light incident on the light-diffusing layer and n is a refractive index of a layer in contact with a side of the light-diffusing layer from which light is emitted, and
a center direction of emission directions of diffuse light diffused by the light-diffusing layer is away from an emission direction of non-diffused light that is refracted according to Snell's law upon impinging on the light-diffusing layer but passes through the light-diffusing layer without being diffused by the light-diffusing layer.

8. A light-emitting device comprising:
a light-emitting unit configured to emits light; and
a light-diffusing layer on which light from the light-emitting unit is incident,
wherein the light-diffusing layer includes a plurality of first microscopic regions and a plurality of second microscopic regions,
the plurality of first microscopic regions and the plurality of second microscopic regions are configured to produce a phase difference between light passing through the plurality of first microscopic regions and light passing through the plurality of second microscopic regions,
the plurality of first microscopic regions and the plurality of second microscopic regions form a pattern having a spatial frequency component that peaks between spatial frequencies of $0.068/(\lambda \times n)$ and $2.8/(\lambda \times n)$, inclusive, where $\lambda$ is a central light emission wavelength of light incident on the light-diffusing layer and n is a refractive index of a layer in contact with a side of the light-diffusing layer from which light is emitted, and
a center direction of emission directions of diffuse light diffused by the light-diffusing layer is away from an emission direction of non-diffused light that is refracted according to Snell's law upon impinging on the light-diffusing layer but passes through the light-diffusing layer without being diffused by the light-diffusing layer.

9. The light-emitting device according to claim 8, further comprising
a light-transmissive substrate through which light from the light-emitting unit passes,
wherein the light-diffusing layer is disposed on a surface of the light-transmissive substrate.

10. The light-emitting device according to claim 8, further comprising
a light-transmissive substrate through which light from the light-emitting unit passes,
wherein the light-diffusing layer is disposed between the light-emitting unit and the light-transmissive substrate.

11. The light-emitting device according to claim 10,
wherein the light-diffusing layer is disposed in contact with the light-transmissive substrate.

12. The light-emitting device according to claim 10, further comprising
an auxiliary optical sheet disposed on a surface of the light-transmissive substrate,
wherein the auxiliary optical sheet has a structure including one of a light-diffusing layer, a diffraction grating, a micro lens, and a pyramid structure, or a combination of at least two of the light-diffusing layer, the diffraction grating, the micro lens, and the pyramid structure.

13. The light-emitting device according to claim 8, further comprising
a reflective layer that reflects light from the light-emitting unit,
wherein the light-diffusing layer is disposed between the reflective layer and the light-emitting unit.

14. The light-emitting device according to claim 8,
wherein the light-emitting device is an organic electroluminescence element.

15. A method for manufacturing the light-emitting device according to claim 8, the method comprising:
forming recesses and protrusions on a light-transmissive substrate; and
forming a light-diffusing layer by filling spaces formed by the recesses and the protrusions with a material having a refractive index different from a refractive index of the light-transmissive substrate.

16. A light-emitting device comprising:

a light-emitting unit configured to emits light; and a light-diffusing layer on which light from the light-emitting unit is incident, wherein the light-diffusing layer includes a plurality of first microscopic regions and a plurality of second microscopic regions, the plurality of first microscopic regions and the plurality of second microscopic regions are configured to produce a phase difference between light passing through the plurality of first microscopic regions and light passing through the plurality of second microscopic regions, when light incident on the light-diffusing layer at an angle greater than a critical angle accounts for 50% or more of a total light intensity of light incident on the light-diffusing layer, the plurality of first microscopic regions and the plurality of second microscopic regions form a pattern having a spatial frequency component that peaks between spatial frequencies of $0.055/(\lambda \times n)$ and $0.45/(\lambda \times n)$, inclusive, where $\lambda$ is a central light emission wavelength of light incident on the light-diffusing layer and n is a refractive index of a layer in contact with a side of the light-diffusing layer from which light is emitted, and a center direction of emission directions of diffuse light diffused by the light-diffusing layer is away from an emission direction of non-diffused light that is refracted according to Snell's law upon impinging on the light-diffusing layer but passes through the light-diffusing layer without being diffused by the light-diffusing layer.

17. An optical sheet comprising a light-diffusing layer having a plurality of protrusions and a plurality of recesses, wherein a spatial frequency component obtained by calculating a Fourier transform of numerical data representing a height distribution of the plurality of protrusions in the light-diffusing layer peaks between spatial frequencies of $0.068/(\lambda \times n)$ and $2.8/(\lambda \times n)$, inclusive, where $\lambda$ is a central light emission wavelength of light incident on the light-diffusing layer and n is a refractive index of a layer in contact with a side of the light-diffusing layer from which light is emitted, and a center direction of emission directions of diffuse light diffused by the light-diffusing layer is away from an emission direction of non-diffused light that is refracted according to Snell's law upon impinging on the light-diffusing layer but passes through the light-diffusing layer without being diffused by the light-diffusing layer.

18. A light-emitting device comprising a light-diffusing layer having a plurality of protrusions and a plurality of recesses, wherein a spatial frequency component obtained by calculating a Fourier transform of numerical data representing a height distribution of the plurality of protrusions in the light-diffusing layer peaks between spatial frequencies of $0.068/(\lambda \times n)$ and $2.8/(\lambda \times n)$, inclusive, where $\lambda$ is a central light emission wavelength of light incident on the light-diffusing layer and n is a refractive index of a layer in contact with a side of the light-diffusing layer from which light is emitted, and a center direction of emission directions of diffuse light diffused by the light-diffusing layer is away from an emission direction of non-diffused light that is refracted according to Snell's law upon impinging on the light-diffusing layer but passes through the light-diffusing layer without being diffused by the light-diffusing layer.

* * * * *